(12) United States Patent
Kodama

(10) Patent No.: US 7,036,215 B2
(45) Date of Patent: *May 2, 2006

(54) METHOD AND PROGRAM FOR OBTAINING POSITIONING ERRORS OF PRINTED-WIRING BOARD, AND ELECTRONIC-CIRCUIT-COMPONENT MOUNTING SYSTEM

(75) Inventor: Seigo Kodama, Yatomi-cho (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 202 days.

This patent is subject to a terminal disclaimer.

(21) Appl. No.: 10/421,882

(22) Filed: Apr. 24, 2003

(65) Prior Publication Data
US 2003/0209679 A1     Nov. 13, 2003

(30) Foreign Application Priority Data
May 8, 2002    (JP)    ............................. 2002-133032

(51) Int. Cl.
*H05K 3/30*    (2006.01)
(52) U.S. Cl. ............................. 29/832; 29/740; 29/825; 29/833; 438/14; 438/15
(58) Field of Classification Search ................. 29/832, 29/833, 740, 825, 840; 438/14, 15
See application file for complete search history.

(56) References Cited

U.S. PATENT DOCUMENTS

| | | | | |
|---|---|---|---|---|
| 4,979,290 A | * | 12/1990 | Chiba | 29/840 |
| 5,566,447 A | * | 10/1996 | Sakurai | 29/832 |
| 6,216,341 B1 | * | 4/2001 | Nakahara | 29/833 |
| 6,538,425 B1 | * | 3/2003 | Kawada | 324/158.1 |
| 6,555,400 B1 | * | 4/2003 | Farnworth et al. | 438/17 |
| 6,681,468 B1 | * | 1/2004 | Uchiyama et al. | 29/407.01 |
| 6,861,269 B1 | * | 3/2005 | Kawai et al. | 438/14 |

* cited by examiner

*Primary Examiner*—Carl J. Arbes
(74) *Attorney, Agent, or Firm*—Oliff & Berridge, PLC

(57) ABSTRACT

An electronic-circuit-component mounting system including at least two component mounting units concurrently operated to mount electronic circuit components on a printed-wiring board, wherein a relative position of the two units is obtained from positions of a common calibration mark fixed provided on machine base commonly for the two units, which positions are detected by fiducial-mark cameras of the two units, or obtained from positions of fiducial marks provided on a fiducial board, which positions are detected by the cameras while the fiducial board is located in alignment with component mounting areas of the two units, and wherein positioning errors of the printed-wiring board relative to the two units are calculated on the basis of the obtained relative position of the two units, and positions of at least two fiducial marks provided on the printed-wiring board, which positions are detected by the cameras of the two units.

13 Claims, 19 Drawing Sheets

METHOD AND PROGRAM FOR OBTAINING POSITIONING ERRORS OF PRINTED-WIRING BOARD, AND ELECTRONIC-CIRCUIT-COMPONENT MOUNTING SYSTEM

This application is based on Japanese Patent Application No. 2002-133032 filed May 8, 2002, the contents of which are incorporated herein by reference.

BACKGROUND OF THE INVENTION

1. Field of the Invention

The present invention relates to an electronic-circuit-component mounting system arranged to mount a plurality of electronic circuit components on a printed-wiring board, a method practiced in this system to obtain positioning errors of the printed-wiring board, a method of mounting the electronic circuit components, and programs for practicing those methods.

2. Discussion of Related Art

There is known an electronic-circuit-component mounting system which includes a plurality of component mounting units arranged along a straight line. Each of the component mounting units is provided with a mounting head and a head moving device operable to move the mounting head. This electronic-circuit-component mounting system is arranged such that at least two of the component mounting units are concurrently operated to mount electronic circuit components on one printed-wiring board. In the electronic-circuit-component mounting system of this type, each printed-wiring board is positioned such that areas of movements of the mounting heads of the at least two component mounting unit cover respective parts of the printed-wiring board on which operations to mount the electronic circuit components are to be concurrently performed by the component mounting heads of the respective component mounting units.

In an electronic-circuit-component mounting system, each printed-wiring board is generally provided with a fiducial portion used to reduce positioning errors of electronic circuit components as mounted on the board, which would be caused by errors of positioning of the board relative to the component mounting units. In this case, a recognition device such as an imaging device is provided for each of the component mounting units, so that the positioning errors of each printed-wiring board relative to each component mounting unit is obtained on the basis of a result of recognition of the fiducial portion by the recognition device. When each electronic circuit component is mounted on the printed-wiring board, data representative of a predetermined position of the corresponding mounting head at which the electronic circuit component is to be mounted on the board are compensated to reduce at least the positioning errors of the board (horizontal positioning errors and an angular or rotational positioning error), and the operation to mount the electronic circuit component on the board is performed by the mounting head located at the compensated position. At this time of compensation, the position of the mounting head is usually compensated to reduce other positioning errors, such as errors of positioning (horizontal positioning errors and an angular positioning error) of the electronic circuit component as held by the mounting head. This compensation, which does not directly relate to the present invention, will not be further discussed herein.

Where the plurality of component mounting units are concurrently operated to perform operations to mount the electronic circuit components on one printed-wiring board, as described above, the board is provided with a plurality of fiducial portions in respective areas thereof corresponding to the respective component mounting units. These fiducial portions are recognized by respective recognition devices provided for the respective component mounting units, and the positioning errors of the printed-wiring board relative to the component mounting units are detected on the basis of outputs of the recognition devices, so that the electronic circuit components are mounted at predetermined positions by moving the mounting heads to the respective positions as compensated according to the detected positioning errors of the board. If the printed-wiring board has only one fiducial portion for each of the component mounting units, it is impossible to obtain the positioning errors of the board relative to each component mounting unit.

In view of the above drawback, there have been proposed the use of a mechanical positioning device and the use of a board-holding device and an imaging device. For example, the mechanical positioning device is arranged to insert positioning pins in a plurality of positioning holes formed in the printed-wiring board, for improving the accuracy of positioning of the printed-wiring board. The board-holding device, which takes the form of a pallet, for example, is arranged to hold the printed-wiring board at a fixed position, and the imaging device is arranged to detect errors of positioning of the board as held by the board-holding device, so that the board-holding device is repositioned with high accuracy on the basis of an output of the imaging device, to improve the positioning accuracy of the electronic circuit components as mounted on the board.

However, the mechanical positioning device is limited in the accuracy of positioning of the printed-wiring boards, and does not easily permit a sufficient improvement in the mounting accuracy of the electronic circuit components. On the other hand, the board-holding device which is arranged to fixedly hold the printed-wiring board thereon and which is repositioned with high accuracy suffers from a problem of an inevitable increase in its structural complexity and an accordingly increased cost of its manufacture.

SUMMARY OF THE INVENTION

The present invention was made in view of the background situation described above. It is an object of the present invention to assure a sufficient improvement in the accuracy of positioning of electronic circuit components as mounted on a printed-wiring board, while minimizing an increase in the cost of manufacture of an electronic-circuit-component mounting system of a type wherein a plurality of component mounting units are concurrently operated to perform operations to mount the electronic circuit components on the printed-wiring board. This object may be achieved according to any one of the following modes of this invention in the form of a method of obtaining positioning errors of a printed-wiring board, an electronic-circuit-component mounting system, a program for obtaining the positioning errors of the printed-wiring board, an electronic-circuit-component mounting program, or an electronic-circuit-component mounting system. Each of the following modes is numbered like the appended claims and depends from the other mode or modes, where appropriate, for easy understanding of the invention. It is to be understood that the present invention is not limited to the technical features of the following modes or any combinations thereof. It is to be further understood that a plurality of elements or features included in any one of the following modes of the invention are not necessarily provided all together, and that the invention may be embodied with only selected one or ones of the elements or features described with respect to the same mode.

(1) A method of obtaining positioning errors of a printed-wiring board on which components are to be mounted by a plurality of component mounting units each of which includes a mounting head, a head drive device operable to move the mounting head, and a recognition device, the method comprising:

a board-positioning step of positioning the printed-wiring board relative to the plurality of component mounting units such that areas of movements of the mounting heads of the plurality of component mounting units cover respective parts of the printed-wiring board, in a direction of arrangement of the component mounting units;

a board-fiducial-portion recognizing step of operating the recognition device of each of at least two of the plurality of component mounting units to recognize at least one of a plurality of fiducial portions of the printed-wiring board, which is recognizable by the recognition device;

a specific-position obtaining step of obtaining specific positions of each of the above-indicated at least one of the plurality of fiducial portions, in respective specific coordinate systems respectively specific to the above-indicated at least two component mounting units, on the basis of results of recognition of the above-indicated each fiducial portion by the recognition devices of the at least two component mounting units in the board-fiducial-portion recognizing step; and a positioning-error obtaining step of obtaining positioning errors of the printed-wiring board relative to the specific coordinate systems of the plurality of component mounting units, on the basis of the specific positions of the above-indicated each fiducial portion, which specific positions have been obtained in the specific-position obtaining step.

In the board-fiducial-portion recognizing step, at least one fiducial portion of the printed-wiring board which corresponds to each of the above-indicated at least two component mounting units is recognized by the corresponding recognition device. On the basis of the results of recognition of each fiducial portion by the recognition devices, the specific positions of each recognized fiducial portion in the respective specific coordinate systems of the component mounting units are obtained in the specific-position obtaining step. On the thus obtained specific positions of the fiducial portions of the printed-wiring board, the positioning errors of the printed-wiring board relative to the specific coordinate systems of the component mounting units are obtained in the positioning-error obtaining step.

Where the relative positioning errors of the plurality of component mounting units are negligibly small, the positioning errors of the printed-wiring board relative to the specific coordinate systems of the individual component mounting units can be obtained with high accuracy, on the basis of the specific positions of the fiducial portion of the board in the specific coordinate systems which have been obtained in the specific-position obtaining step. Where the relative positioning errors of the component mounting units are comparatively large, on the other hand, it is desirable to first obtain the relative positioning errors of the component mounting units as described below, and obtain the positioning errors of the printed-wiring board on the basis of not only the obtained specific positions of the fiducial portion but also the obtained relative positioning errors of the component mounting units. In either of those cases, the positioning errors of the components (e.g., electronic-circuit components) as mounted on the printed-wiring board can be reduced by controlling the component mounting units while taking account of the obtained positioning errors of the printed-wiring board relative to the component mounting units.

(2) The method according to the above mode (1), wherein the specific-position obtaining step is implemented by a control device of each of the above-indicated at least two component mounting units, and the positioning-error obtaining step comprises (a) controlling the control device of each of the at least two component mounting units so as to receive the specific position of each of the above-indicated at least one of the plurality of fiducial portions which has been obtained by a control device of each of the other component mounting unit or units, and (b) obtaining the positioning errors of the printed-wiring board on the basis of the specific position received from the control device of each of the other of the at least two component mounting units, and the specific position of each of the above-indicated at least one of the plurality of fiducial portions which has been obtained by the control device of each component mounting unit.

Where the specific-position obtaining step is implemented by each of the control devices of the above-indicated at least two component mounting units, the specific position of at least one fiducial portion of the printed-wiring board is obtained by each control device, and the thus obtained specific position is supplied to the control device of each of the other component mounting unit or units. The control device of each of the at least two component mounting units obtains the positioning errors of the printed-wiring board on the basis of the specific position of each of the at least one fiducial portion obtained by itself, and the specific position of each of the at least one fiducial portion received from the other control device or devices.

(3) The method according to the above mode (1), wherein the results of recognition of each of the above-indicated at least one of the plurality of fiducial portions by the recognition devices of the above-indicated at least two component mounting units are supplied to a common computer provided commonly for all of the plurality of component mounting units, and the specific-position obtaining step and the positioning-error obtaining step are implemented by the common computer.

In the method of obtaining the positioning errors of the printed-wiring board according to the above mode (3), the positioning errors of the printed-wiring board relative to the specific coordinate systems of the plurality of component mounting units are obtained by the common computer provided commonly for those plurality of component mounting units. In this mode of the invention, the use of only one common computer is not essential. For instance, the present method may use two common computers, namely, a first common computer arranged to process the results of recognition of the fiducial portions by the recognition devices, and obtain positioning errors of the fiducial portions relative to the recognition devices, and a second common computer arranged to obtain positioning errors of the fiducial portions relative to the component mounting units, and the positioning errors of the printed-wiring board per se relative to the component mounting units, on the basis of the positioning errors of the fiducial portions relative to the recognition devices, which have been obtained by the first common computer.

(4) The method according to any one of the above modes (1)–(3), further comprising a relative-position obtaining step implemented before the positioning-error obtaining step, to obtain a relative position of the plurality of component mounting units, and the positioning-error obtaining step comprises obtaining the positioning errors of the printed-wiring board on the basis of not only the specific positions of the fiducial portions obtained in the specific-position obtaining step, but also the relative position of the component mounting units obtained in the relative-position obtaining step.

The relative-position obtaining step may be a step of obtaining the relative position of the plurality of component mounting units before the positioning-error obtaining step, storing the obtained relative position in a memory and reading out the relative position from the memory. Alternatively, the relative-position obtaining step may be a step of actually detecting the relative position of the component mounting units before the positioning-error obtaining step. In the latter case, the relative-position detecting step as the relative-position obtaining step may be implemented before or after the board-fiducial-portion recognizing step, or after the specific-position obtaining step.

(5) The method according to the above mode (4), wherein the relative-position obtaining step comprises:

a machine-fiducial-portion recognizing step of operating the recognition devices provided on the mounting heads of the plurality of component mounting units, to recognize a plurality of machine fiducial portions fixed in position relative to the mounting heads, the plurality of machine fiducial portions including a plurality of specific fiducial portions provided exclusively for the plurality of component mounting units, and at least one common fiducial portion provided commonly for adjacent ones of the plurality of component mounting units; and a step of obtaining the relative position between the adjacent ones of the plurality of component mounting units, on the basis of results of recognition of the machine fiducial portion by the recognition devices in the machine-fiducial-portion recognizing step.

The machine fiducial portions may be fixed on a machine base on which the plurality of component mounting units are mounted, or on the component mounting units. In the method according to the above mode (5), the recognition devices of the adjacent two component mounting units are arranged to recognize the specific fiducial portions corresponding to the adjacent two component mounting units, and the common fiducial portion provided commonly for the adjacent two component mounting units. The relative position between these adjacent two component mounting units can be obtained on the basis of results of recognition of those specific and common fiducial portions of the main body by the two recognition devices. Where the relative angular or rotational positioning errors between the adjacent two component mounting units are negligibly small, the relative position between these adjacent two units can be obtained by recognition by the two recognition devices of only the common fiducial portion corresponding to the adjacent two units, and the provision and recognition of the specific fiducial portions are not essential to obtain the relative position.

(6) The method according to the above mode (4), wherein the relative-position obtaining step comprises:

a step of preparing a fiducial board having a length in the direction of arrangement of the plurality of component mounting units, which length is large enough to extend through at least a part of the area of movement of the mounting head of each of the plurality of component mounting units, the fiducial board having at least one board fiducial portion corresponding to the area of movement of the mounting head of each component mounting unit;

a board-fiducial-portion recognizing step of positioning the fiducial board such that the areas of movement of the mounting heads of the plurality of component mounting units cover respective parts of the fiducial board each of which has the at least one fiducial portion, and operating the recognition device provided on the mounting head of each component mounting unit, to recognize at least one of the above-indicated at least one board fiducial portion; and a step of obtaining the relative position of the plurality of component mounting units on the basis of a result of recognition of the board fiducial portions by the recognition devices in the board-fiducial-portion obtaining step.

The relative position between the adjacent two component mounting units can be easily detected by using the fiducial board the length of which is sufficient to extend through at least a part of the area of movement of the mounting head of each component mounting unit, and which has at least one board fiducial portion corresponding to the area of movement of the mounting head of each component mounting unit. Where the relative angular or rotational positioning errors between the adjacent two component mounting units are negligibly small, the relative position of the adjacent units can be obtained by recognition of only one board fiducial portion corresponding to the area of movement of the mounting head of each unit. Where the relative angular positioning errors are not negligibly small, the fiducial board is required to have at least two board fiducial portions corresponding to the area of movement of the mounting head of each unit, for accurately detecting the relative position.

(7) The method according to any one of the above modes (1)–(4), wherein the recognition device is provided on the mounting head of each of the plurality of component mounting units.

Preferably, the fiducial portions of the printed-wiring board are fiducial marks provided on the printed-wiring board, while the recognition device is an imaging device operable to take images of the fiducial marks. Although the recognition device may be moved by an exclusive drive device, within the area of movement of the mounting head, the recognition device is preferably provided on the mounting head. Where the recognition device is provided on the mounting head, a system to obtain the positioning errors of the printed-wiring board can be simplified in construction and is available at a reduced cost. Further, the accuracy of detection of the positioning errors of the printed-wiring board can be improved in the absence of a drive device exclusively provided for moving the recognition device, since the detected positioning errors of the printed-wiring board would not be influenced by relative positioning errors between a drive device for the mounting head and the drive device for the recognition device.

(8) The method according to any one of the above modes (1)–(7), wherein the positioning-error obtaining step comprises a step of obtaining an imaginary coordinate system for the printed-wiring board, relative to the specific coordinate systems specific to the plurality of component mounting units, on the basis of the specific positions of each of the above-indicated at least one of the plurality of fiducial portions which have been obtained in the specific-position obtaining step.

The imaginary coordinate system for the printed-wiring board is a coordinate system in which the positions of the fiducial portions of the board are defined with respect to the board rather than the component mounting units. Where the dimensional errors of the printed-wiring board are negligibly small, the imaginary coordinate system for the board is the same as a nominal coordinate system set for the board of the nominal dimensions. Irrespective of whether the dimensional errors of the printed-wiring board are negligibly small or not, the position of the imaginary coordinate system of the printed-wiring board relative to the specific coordinate system of each component mounting unit is considered to represent a kind of the positioning errors of the printed-wiring board relative to the specific coordinate system of each unit.

(9) A method of mounting electronic circuit components on a printed-wiring board, comprising:

a board-fiducial-portion recognizing step, a specific-position obtaining step and a positioning-error obtaining step of a method of obtaining positioning errors of the printed-wiring board, as defined in any one of the above modes (1)–(8); and a mounting step of mounting the electronic circuit components on the printed-wiring board by the plurality of component mounting units, such that component mounting positions at which the printed-wiring board and the mounting heads of the plurality of component mounting units are positioned relative to each other to mount the electronic circuit components on the printed-wiring board are compensated for at least the positioning errors of the printed-wiring board obtained in the positioning-error obtaining step.

In the component mounting method according to the above mode (9), the positions at which the printed-wiring board and the mounting heads are positioned relative to each other to mount the electronic circuit components on the board are compensated for the positioning errors of the board relative to the component mounting units, so that the positioning accuracy of the electronic circuit components as mounted on the board can be significantly improved.

(10) The method according to the above mode (9), wherein the positioning-error obtaining step comprises a step of obtaining an imaginary coordinate system for the printed-wiring board, relative to the specific coordinate systems specific to the plurality of component mounting units, on the basis of the specific positions of each of the above-indicated at least one of the plurality of fiducial portions which have been obtained in the specific-position obtaining step, the present method of mounting electronic circuit components further comprising a converting step of converting coordinate values of a plurality of mounting points of the electronic circuit components predetermined in a nominal coordinate system set for a nominal printed-wiring board, into values relating to the mounting points in the specific coordinate systems, on the basis of positional relationships among the nominal coordinate system for the nominal printed-wiring board, the imaginary coordinate system obtained for the printed-wiring board, and the specific coordinate systems of the component mounting units.

The "values relating to the mounting spots" obtained in the converting step may represent the component mounting positions at which the electronic circuit components are actually mounted by the mounting heads on the printed-wiring board. Alternatively, the values relating to the mounting points may represent amounts of compensation of the component mounting positions of the mounting heads to change the predetermined mounting points where the printed-wiring board does not have dimensional and positioning errors, to actual mounting points where the board has positioning errors (and dimensional errors that are not negligibly small). The coordinate values of the mounting points of the electronic circuit components in the specific coordinate systems, and the amounts of compensation of the mounting heads can be obtained by coordinate value conversion among the nominal and imaginary coordinate systems of the printed-wiring board and the specific coordinate systems of the component mounting units.

(11) A program for obtaining positioning errors of a printed-wiring board on which components are to be mounted by a plurality of component mounting units each of which includes a mounting head, a head drive device operable to move the mounting head, and a recognition device, the program comprising:

a board-positioning step of positioning the printed-wiring board relative to the plurality of component mounting units such that areas of movement of the mounting heads of the plurality of component mounting units cover respective parts of the printed-wiring board, in a direction of arrangements of the component mounting units;

a recognition-result obtaining step of operating the recognition device of each of at least two of the plurality of component mounting units to recognize at least one of a plurality of fiducial portions of the printed-wiring board, which is recognizable by the recognition device, and obtaining information indicative of results of recognition of each of the above-indicated at least one of the plurality of fiducial portions by the recognition devices of the above-indicated at least two component mounting units;

a specific-position obtaining step of obtaining specific positions of each of the above-indicated at least one of the plurality of fiducial portions, in respective coordinate systems respectively specific to the above-indicated at least two component mounting units, on the basis of the results of recognition obtained in the recognition-result obtaining step; and a positioning-error obtaining step of obtaining positioning errors of the printed-wiring board relative to the specific coordinate systems of the plurality of component mounting units, on the basis of the specific positions of each of the above-indicated at least one of the plurality of fiducial portions, which specific positions have been obtained in the specific-position obtaining step.

The program according to the above mode (11) is executed by a computer provided commonly for the plurality of component mounting units. The recognition-result obtaining step may be formulated to obtain data on the fiducial portions of the printed-wiring board from the recognition devices, or information indicative of relative positions between the fiducial portions of the board and the recognition devices, which information has been obtained by another computer provided to process the data on the recognized fiducial portions. In the former case, the specific-position obtaining step includes a step of processing the data on the recognized fiducial portions of the printed-wiring board, to obtain the relative positions between the fiducial portions and the recognition devices.

(12) A program for obtaining positioning errors of a printed-wiring board on which electronic circuit components are to be mounted by an electronic-circuit-component mounting system comprising (a) a plurality of component mounting units arranged along a straight line and including respective mounting heads and head drive devices operable to move the respective mounting heads, (b) a conveying device operable to transfer the printed-wiring board along the straight line and stop the printed-wiring board at a predetermined position relative to at least two units of the plurality of component mounting units such that areas of movement of the mounting heads of the above-indicated at least two units cover respective parts of the printed-wiring board, (c) a plurality of individual control devices including respective computers and operable to control the plurality of component mounting units, respectively, and (d) a plurality of recognition devices respectively provided for the plurality of component mounting units and operable to recognize fiducial portions of the printed-wiring board stopped at the predetermined position, the program being executed by each of the computers and comprising:

a positioning-error obtaining step of obtaining positioning errors of the printed-wiring board stopped at the predetermined position, with respect to a specific coordinate system specific to one of the above-indicated at least two units, on the basis of a position of at least one of the fiducial portions of the printed-wiring board in the specific coordinate system for the above-indicated one of the at least two units, and a position of at least one other of the fiducial portions in a specific coordinate system specific for another of the at least two units, the positions of the above-indicated at least one and at least one other of the fiducial portions being obtained on the basis of results of recognition of the above-indicated at least one and at least one other of the fiducial portions by the recognition devices corresponding to the above-indicated one and another of the above-indicated at least two units.

The program according to the above mode (12) is executed by the computer of each of the individual control devices provided for the respective component mounting units for controlling these units.

It is to be understood that the present program for obtaining the positioning errors of the printed-wiring board may incorporate any of the technical features described above with respect to the above modes (4)–(8) and the following (14). It is noted that the present invention provides a method of obtaining the positioning errors of the printed-wiring board, which is practiced according to the program of the above mode (12).

(13) A program for mounting electronic circuit components on a printed-wiring board by an electronic-circuit-component mounting system comprising (a) a plurality of component mounting units arranged along a straight line and including respective mounting heads and head drive devices operable to move the respective mounting heads, (b) a conveying device operable to transfer the printed-wiring board along the straight line and stop the printed-wiring board at a predetermined position relative to at least two units of the plurality of component mounting units such that areas of movement of the mounting heads of the above-indicated at least two units cover respective parts of the printed-wiring board, (c) a plurality of individual control devices including respective computers and operable to control the plurality of component mounting units, respectively, and (d) a plurality of recognition devices respectively provided for the plurality of component mounting units and operable to recognize fiducial portions of the printed-wiring board stopped at the predetermined position, the program being executed by each of the computers and comprising:

a positioning-error obtaining step of obtaining positioning errors of the printed-wiring board stopped at the predetermined position, with respect to a specific coordinate system specific to one of the above-indicated at least two units, on the basis of a position of at least one of the fiducial portions of the printed-wiring board in the specific coordinate system for the above-indicated one of the above-indicated at least two units, and a position of at least one other of the fiducial portions in a specific coordinate system specific for another of the at least two units, the positions of the above-indicated at least one and at least one other of the fiducial portions being obtained on the basis of results of recognition of the above-indicated at least one and at least one other of the fiducial portions by the recognition devices corresponding to the one and another of the at least two units; and a mounting controlling step of compensating a plurality of nominal mounting points of the electronic circuit components predetermined for a nominal printed-wiring board, for at least the positioning errors of the printed-wiring board obtained in the positioning-error obtaining step, and controlling the above-indicated at least two units of the plurality of component mounting units to mount the electronic circuit components at the compensated nominal mounting points.

The program according to the above mode (13) is executed by the computer of each of the individual control devices provided for the respective component mounting units for controlling these units.

It is to be understood that the present program for mounting the electronic circuit components on the printed-wiring board may incorporate any of the technical features described above with respect to the above modes (4)–(8) and the following (14).

(14) An electronic-circuit-component mounting system arranged to mount electronic circuit components on a printed-wiring board, comprising:

a plurality of component mounting units arranged along a straight line and including respective mounting heads and head drive devices operable to move the respective mounting heads;

a conveying device operable to transfer the printed-wiring board along the straight line and stop the printed-wiring board at a predetermined position relative to at least two units of the plurality of component mounting units such that areas of movement of the mounting heads of the above-indicated at least two units cover respective parts of the printed-wiring board;

a plurality of individual control devices including respective computers and operable to control the plurality of component mounting units, respectively;

a plurality of recognition devices respectively provided for the plurality of component mounting units and operable to recognize fiducial portions of the printed-wiring board stopped at the predetermined position:

a positioning-error obtaining device connected to the plurality of recognition devices, to obtain positioning errors of the printed-wiring board stopped at the predetermined position, with respect to a specific coordinate system specific to one of the above-indicated at least two units, on the basis of a position of at least one of the fiducial portions of the printed-wiring board in the specific coordinate system for the above-indicated one of the above-indicated at least two units, and a position of at least one other of the fiducial portions in a specific coordinate system specific for another of the above-indicated at least two units, the positions of the above-indicated at least one and at least one other of the fiducial portions being obtained on the basis of results of recognition of the above-indicated at least one and at least one other of the fiducial portions by the recognition devices corresponding to the above-indicated one and another of the at least two units; and a compensating device operable to compensate a plurality of nominal mounting points of the electronic circuit components predetermined for a printed-wiring board, for at least the positioning errors of the printed-wiring board obtained by the positioning-error obtaining device, and wherein at least two control devices of the at least two units of the plurality of component mounting units are operable to control the above-indicated at least two units to mount the electronic circuit components at the mounting points as compensated by the compensating device.

The positioning-error obtaining device and the compensating device may be incorporated in each of the individual control devices. At least one of the positioning-error obtaining device and the compensating device may be incorporated by another computer other than the control devices indicated above.

The electronic-circuit-component mounting system according to the above mode (14) is arranged to obtain the positioning errors of the printed-wiring board with respect to the specific coordinate system of one of the above-indicated at least two units of the component mounting units, and the positioning errors of the board with respect to the specific coordinate system of another of the above-indicated at least two units. On the basis of the obtained positioning errors of the printed-wiring board relative to the at least two units, the nominal mounting points of the electronic circuit components are compensated for the at least two units, and these at least two units are concurrently operated to mount the electronic circuit components at the compensated nominal mounting points.

The electronic-circuit-component mounting system according to the above mode (14) is suitable to practice the electronic-circuit-component mounting method according to the above mode (9).

It is to be understood that the electronic-circuit-component mounting system according to the above mode (14) may incorporate any one of the technical features described above (1)–(8) and (10)–(13).

(15) The electronic-circuit-component mounting system according to the above mode (14), further comprising a relative-position obtaining device operable to obtain a relative position of the above-indicated at least two units of the plurality of component mounting units, and the positioning-error obtaining device is operable to obtain the positioning errors of the printed-wiring board with respect to the above-indicated one of the above-indicated at least two units, on the basis of not only the positions of the above-indicated at least one and at least one other of the fiducial portions, but also the relative position of the at least two units obtained by the relative-position obtaining device.

BRIEF DESCRIPTION OF THE DRAWINGS

The above and other objects, features, advantages and industrial and technical significance of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
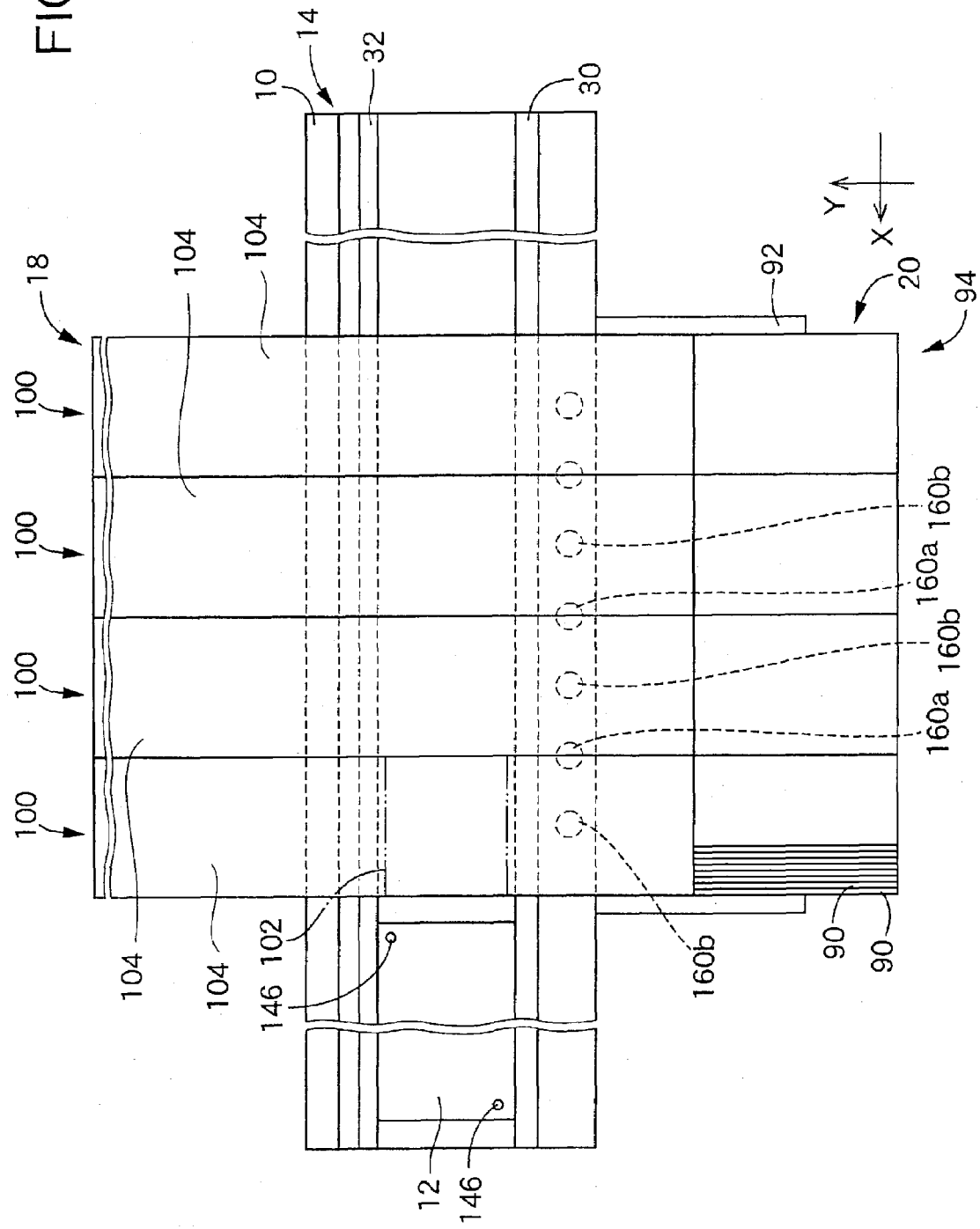
FIG. 1 is a plan view schematically showing an electronic-circuit-component mounting system according to one embodiment of this invention.
Figure 5:
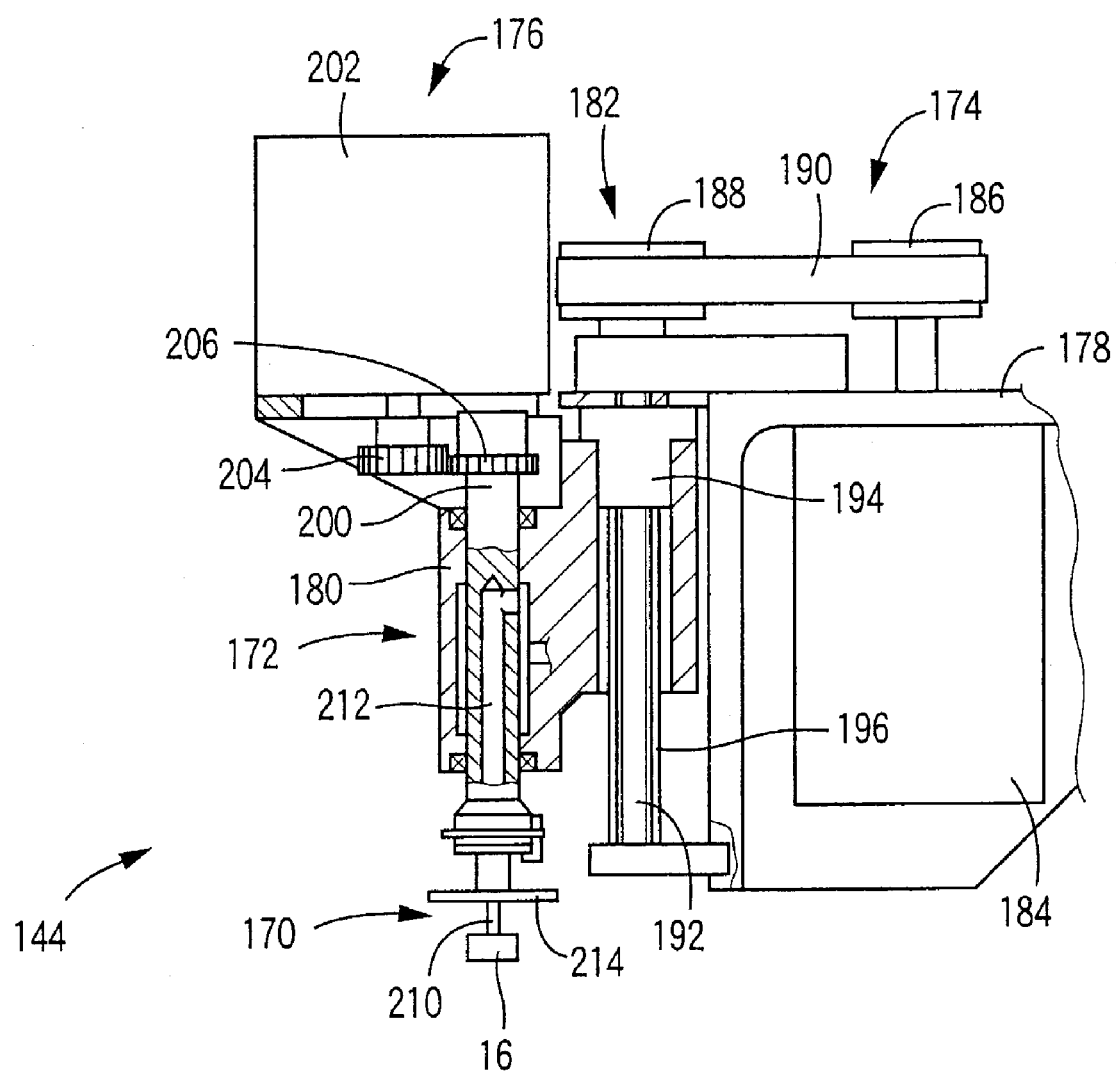
FIG. 5 is a side elevational view (partly in cross section) showing a mounting head of the above-indicated system.

There will be described in detail an electronic-circuit-component mounting system according to the present invention. In FIG. 1, reference sign 10 denotes a machine base. On this machine base 10, there are disposed a conveying device in the form of a printed-wiring-board conveyor 14 arranged to feed a printed-wiring board 12 in one horizontal direction, and a component mounting device 18 arranged to mount electronic circuit components (hereinafter referred to simply as "components") 16 on the printed-wiring board 12. One of the components 16 is shown in FIG. 5. On the machine base 10, there is also disposed a component supplying device 20 arranged to supply the component mounting device 18 with the components 16.

Figure 2:
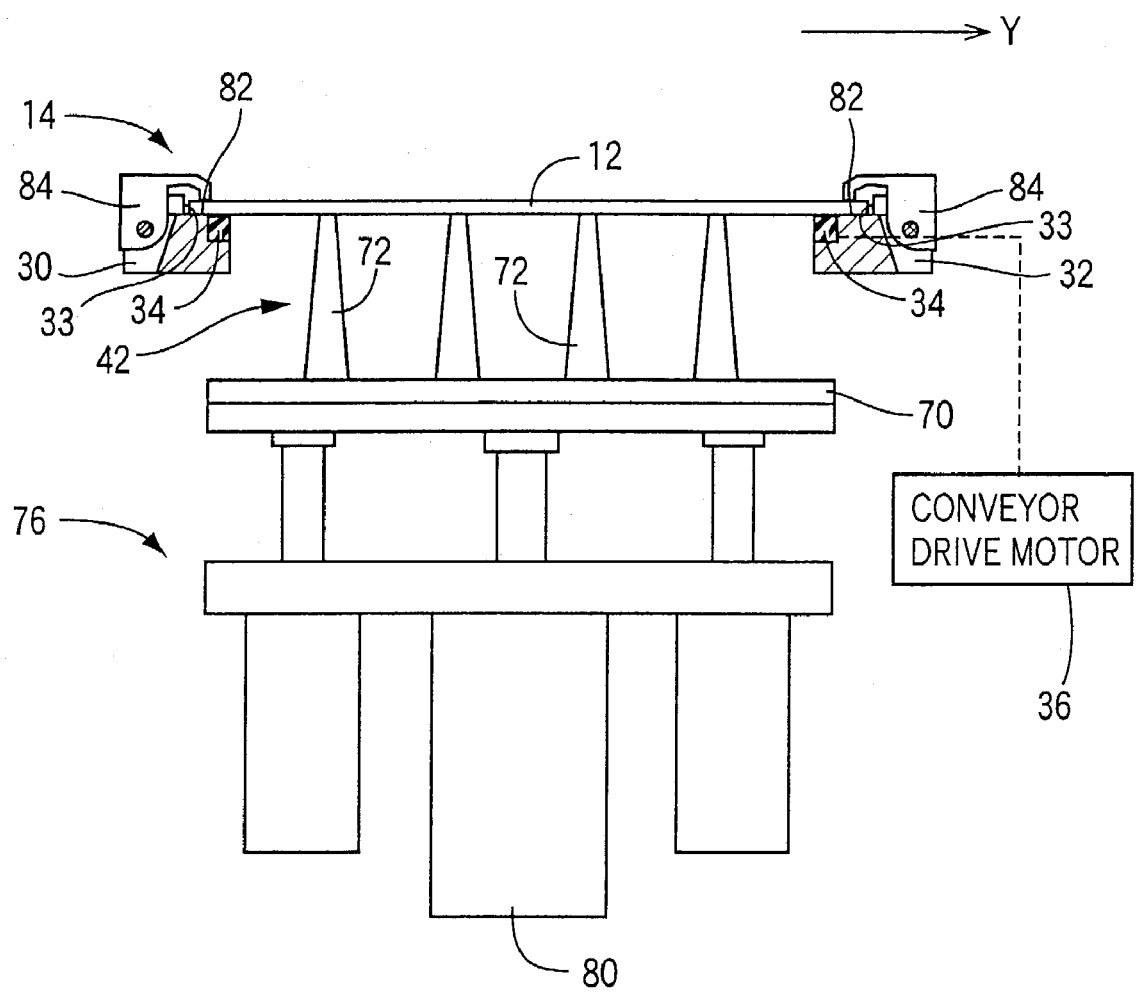
FIG. 2 is a side elevational view (partly in cross section) showing a part of the above-indicated electronic-circuit-component mounting system.

The printed-wiring-board conveyor 14 (hereinafter referred to simply as "board conveyor 14") is provided with a pair of side frames 30, 32 extending in the direction of feeding of the printed-wiring board 12, that is, in an X-axis direction indicated in FIG. 1. These side frames 30, 32 have respective portions serving as guides 33 for guiding the printed-wiring board 12, as shown in FIG. 2. The side frame 30 is a fixed frame fixed on the machine base 10, while the other side frame 32 is a movable frame mounted movably on the machine base 10 such that the movable frame 32 is movable toward and away from the fixed frame 30 in a Y-axis direction also indicated in FIG. 1. To move the movable frame 32, there is provided a moving device (not shown) which is operatively connected to a lower portion of the movable frame 32, to move the movable frame 32 in the Y-axis direction. The fixed and movable side frames 30, 32 are provided with respective annular or endless conveyor belts 34, which are driven by a drive source in the form of a conveyor drive motor 36 (shown in FIG. 6), in synchronization with each other, to feed the printed-wiring board 12.

Between the pair of side frames 30, 32 of the board conveyor 14, there are disposed a plurality of printed-wiring-board supporting devices 42 arranged to support the printed-wiring board 12. The printed-wiring-board supporting devices 42 (herein after referred to simply as "board supporting devices 42") are arranged in the X-axis direction in which the printed-wiring board 12 is fed by the board conveyor 14. Each of the board supporting devices 42 is provided at its downstream end with a stopper device, which is arranged for abutting contact with the downstream end face of the printed-wiring board 12, to thereby position the printed-wiring board 12 in the X-axis direction.

The board supporting device 42 includes a support platform 70 provided with a plurality of support pins 72 mounted thereon, and a platform elevating and lowering device 76 operable to vertically move the support platform 70. The platform elevating and lowering device 76 includes actuators in the form of air cylinders 80 operable to vertically move the support platform 70 between an upper position or a support position at which the printed-wiring board 12 is supported by the support pins 72, and a lower position or a non-operated position at which the printed-wiring board 12 is permitted to be moved in the horizontal direction (in the X-axis direction). Each of the side frames 30, 32 has a support surface 82 facing upwards, and a pivotally supported clamping member 84, so that the printed-wiring board 12 is clamped in the vertical direction between the support surfaces 82 and the clamping members 84 of the side frames 30,32.

The component supply device 20 is of feeder type arranged to successively feed components 16 to a predetermined component supply position one after another. The component supply device 20 of feeder type includes a support block 92, a component supply table 94 fixed on the support block 92, and a multiplicity of component feeders 90 arranged in the X-axis direction on the component supply table 94 such that component supply portions of the component feeders 90 are aligned with a straight line parallel to the X-axis direction. Each of the component feeders 90 is constructed to feed a succession of components 16 such that the components 16 reach its component supply portion one after another. For instance, each component feeder 90 is arranged to feed a carrier tape (not shown) which accommodates a succession of components 16.

Figure 3:
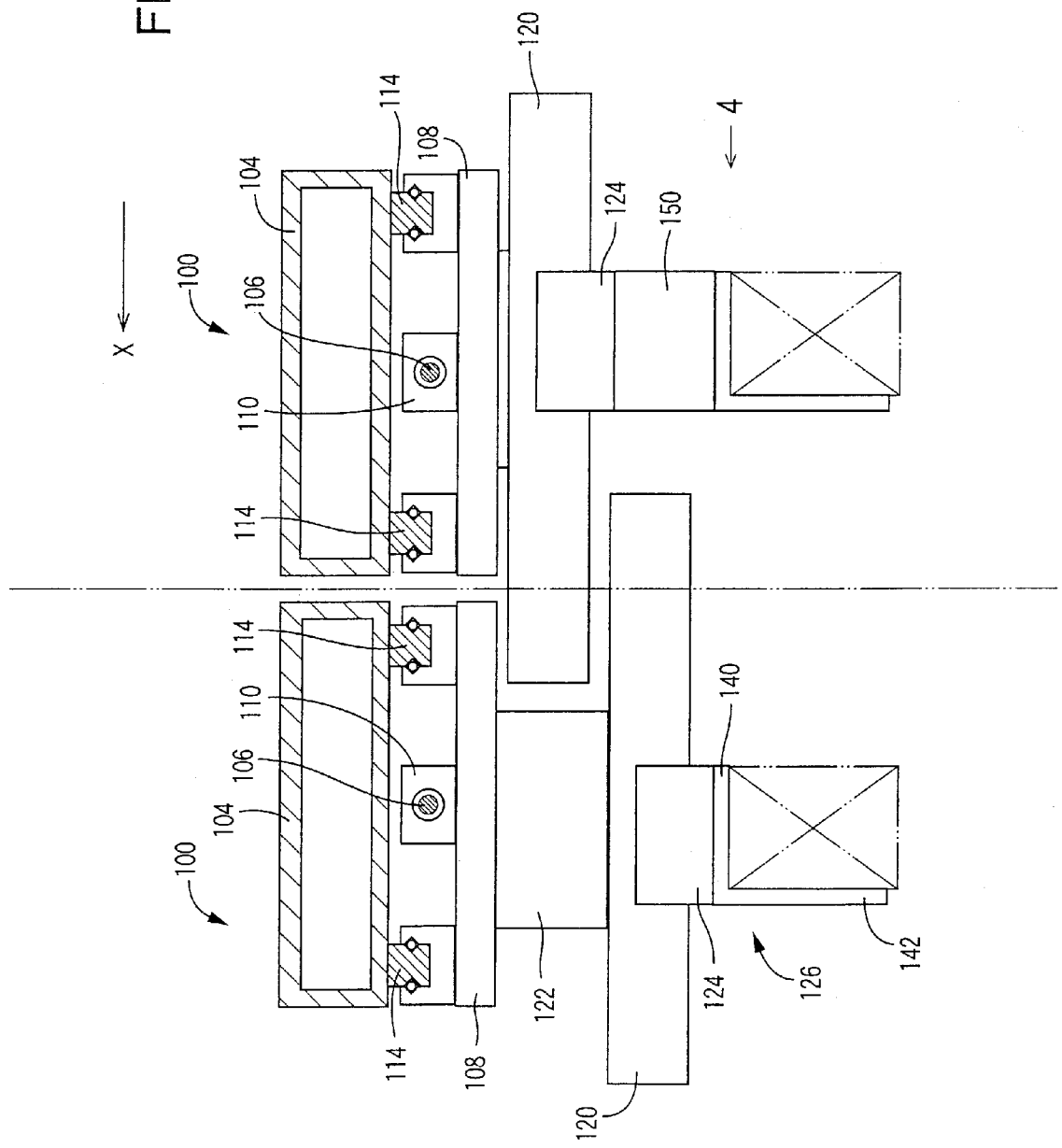
FIG. 3 is a front elevational view (partly in cross section) showing another part of the above-indicated electronic-circuit-component mounting system.

The component mounting device 18 includes a plurality of component mounting units 100, which are arranged side by side in the X-axis direction, as indicated in FIGS. 1 and 3. The adjacent two component mounting units 100 have respective mounting areas 102 which overlap each other at one or both of the opposite end portions. As shown in FIG. 1, the component mounting units 100 have respective main bodies 104 which are fixedly arranged on the machine base 10, in the X-axis direction without gaps between the adjacent units 100, and which extend over the board conveyor 14 in the Y-axis direction, having a length sufficient to reach the component supply device 20. A feedscrew in the form of a ballscrew 106 is fixed to the underside of the main body 104 of each component mounting unit 100, such that the ballscrew 106 extends in the Y-axis direction. The feedscrew 106 is held in engagement with a ballnut 110 fixed to a Y-axis slide 108. When the ballscrew 106 is rotated by a drive source in the form of a Y-axis drive servomotor 112 (shown in FIG. 6), the Y-axis slide 108 is moved in the Y-axis direction while being guided by guide rails 114 fixed to the main body 104. The ballscrew 106, ballnut 110 and Y-axis drive servomotor 112 cooperate with each other to constitute a Y-axis slide drive device.

Figure 4:
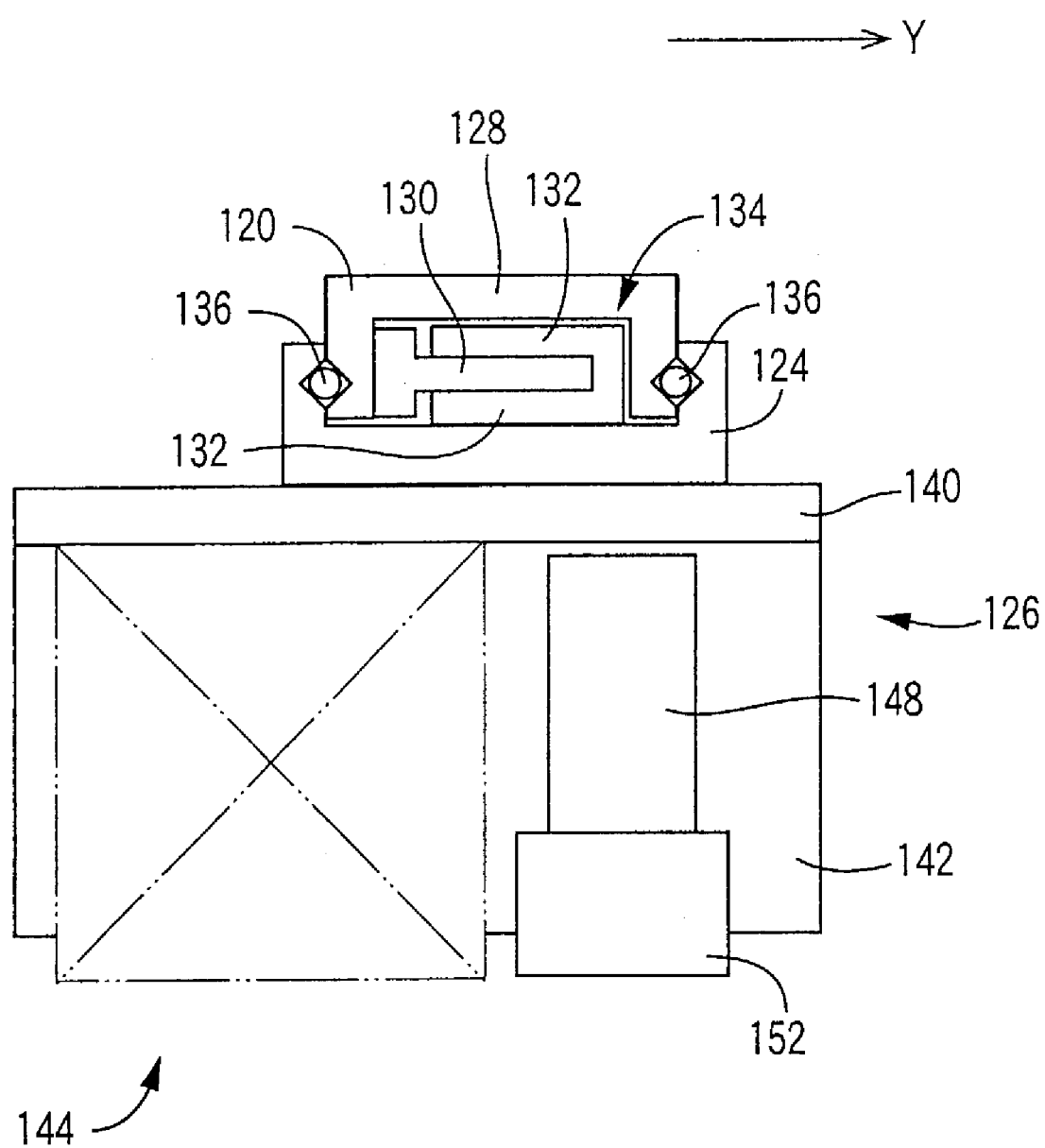
FIG. 4 is a view taken in a direction of an arrow 4 in FIG. 3.

To the underside of the Y-axis slide 108 of each component mounting unit 100, there is fixed a support member 120 extending in the XY plane, namely, in the X-axis direction perpendicular to the Y-axis direction, such that the support member 120 is not movable relative to the Y-axis slide 108. As shown in FIG. 4, each of the support members 120 of the adjacent two component mounting units 100 extends beyond the opposite ends of the corresponding main body 104 in the X-axis direction, such that the opposite end portions of the support member 120 are located in respective spaces underlying the adjacent main bodies 104. The support members 120 of the adjacent component mounting units 100 have respective different vertical positions, to prevent an interference therebetween when the corresponding Y-axis slides 108 are moved in the Y-axis direction. Described in detail, a spacer 122 is interposed between the Y-axis slide 108 and the support member 120 of one of the adjacent two component mounting units 100, while the spacer 122 is not interposed between the Y-axis slide 108 and the support member 120 of the other of the adjacent two component mounting units 100, so that the Y-axis slide 108 of the above-indicated other unit 100 directly rests on the corresponding support member 120. In this arrangement, the support member 120 of one of the adjacent two component mounting units 100 has a comparatively low level, while the support member 120 of the other unit 100 has a comparatively high level.

As shown in FIG. 3, an X-axis slide 126 is supported by the support member 120 of each component mounting unit 100 via a guide block 124, which is U-shaped in transverse cross section, as shown in FIG. 4. The X-axis slide 126 is moved in the X-axis direction by a linear motor 128 incorporated within the support member 120, as shown in FIG. 4. The linear motor 128 is a linear DC brushless motor including a stator 130 provided with a multiplicity of permanent magnets, and a pair of movable members 132 each provided with a plurality of coils. The stator 130 is fixed to the inner surface of the support member 120 such that the stator 130 has a horizontal attitude. The pair of movable members 132 are located above and below the stator 130 with suitable amounts of gap therebetween in the vertical direction, and are integrally connected to each other at their free ends, so as to form a U-shaped movable structure which functions as a movable portion 134 of the linear motor 128. The movable portion 134 is moved with the guide block 124, to a desired position relative to the stator 130, by controlling an amount of electric current to be applied to the coils of the movable members 132. The guide block 124 is held in engagement with the support member 120 through a multiplicity of balls 136 interposed therebetween. Thus, the support member 120 and the guide block 124 cooperate to constitute a guide for guiding the movement of the movable portion 134 of the linear motor 128.

The X-axis slide 126 is fixed to the underside of the guide block 124, so that the X-axis slide 126 is moved with the guide block 124. The X-axis slide 126 includes a supported portion 140, and a main body portion 142 extending downwards from the supported portion 140. The X-axis slide 126 is fixed at its supported portion 140 to the guide block 124. The main body portion 142 of the X-axis slide 126 carries a mounting head 144 arranged to hold the component 16 by suction and mount the component 16 on the printed-wiring board 12. The main body portion 142 further carries an imaging device in the form of a fiducial-mark camera 148 operable to take images of fiducial marks 146, which are provided on the printed-wiring board 12, as shown in FIG. 1. In each component mounting unit 100 in the present embodiment, the mounting head 144 and the fiducial-mark camera 148 are arranged in the Y-axis direction, as shown in FIG. 4.

As described above, the plurality of component mounting units 100 are arranged in the X-axis direction such that the support members 120 of the adjacent component mounting units 100 have the respective different vertical positions. However, the X-axis slides 126 of the adjacent two component mounting units 100 have the same vertical position, as indicated in FIG. 3. Namely, a spacer 150 having the same vertical or height dimension as the above-indicated spacer 122 is interposed between the guide block 124 and the X-axis slide 126 in the component mounting unit 100 the support member 120 of which has the comparatively high vertical position or level. In the component mounting unit 100 the support member 120 of which has the comparatively low vertical position or level, on the other hand, the X-axis slide 126 is directly attached to the guide block 124. Thus, all of the X-axis slides 126 have the same vertical position.

The fiducial-mark camera 148 is a CCD camera, which is fixedly disposed on the X-axis slide 126 such that the CCD camera extends in the vertical direction and faces downwards. An illuminating device 152 in the form of a ring is disposed in alignment with the optical axis of the fiducial-mark camera 148. The illuminating device 152 is operable to irradiate the surface of the printed-wiring board 12 when the fiducial marks 146 are imaged by the fiducial-mark camera 148. In the present embodiment, the fiducial-mark camera 148 is also operable to take images of calibration marks 160 which will be described.

As shown in FIG. 1, the calibration marks 160 are fixedly provided as machine fiducial portions on the machine base 10, at a Y-axis position between the component supplying device 20 and the fixed frame 30 of the board conveyor 14, and at the same vertical position as the component-mounting surface of the printed-wiring board 12 as held by the board supporting device 42. The calibration marks 160 are precisely arranged in the X-axis direction (in the board feeding direction), exactly at a predetermined spacing interval or pitch in the X-axis direction. Described in detail, the calibration marks 160 consist of common marks 160*a* common to the adjacent two component mounting units 100, and specific marks 160*b* specific to the respective component mounting units 100. Each specific mark 160*b* is located at an X-axis position which is a center point in the imaging area of the fiducial-mark camera 148 of the corresponding component mounting unit 100 in the X-axis direction, while each common mark 160*a* is located between the adjacent two specific marks 160*b* in the X-axis direction, that is, located at a boundary of the imaging areas of the fiducial-mark cameras 148 of the adjacent two component mounting units 100. The imaging area of the fiducial-mark camera 148 is an area in which the camera 148 is operable to take an image.

As described in greater detail, images of these calibration marks 160 are taken by the fiducial-mark cameras 148, to detect the relative positions of the component mounting units 100, which are used to detect positioning errors of the printed-wiring board 12.

Each of the mounting heads 144 of the component mounting units 100 has a construction similar to that disclosed in JP-A-7-45996. As shown in FIG. 5, the mounting head 144 has a component holder in the form of a suction nozzle 170, a nozzle holder 172 for holding the suction nozzle 170, a holder elevating and lowering device 174, and a holder rotating device 176. The holder elevating and lowering device 174 is operable to move the nozzle holder 172 in the vertical direction perpendicular to the horizontal XY plane, namely, to elevate and lower the nozzle holder 172, toward and away from the printed-wiring board 12. The holder rotating device 176 is operable to rotate the nozzle holder 172 about its vertical axis of rotation.

The holder elevating and lowering device 174 includes a vertically movable member 180 movably disposed on a bracket 178 fixed to the main body portion 142, and a vertically moving device 182 operable to vertically move the vertically movable member 180. The vertically moving device 182 includes a drive source in the form of a vertical drive motor 184, and a feed screw in the form of a ballscrew 192 to which a rotary motion of the vertical drive motor 184 is transmitted through a rotation transmitting device which includes a driving pulley 186, a driven pulley 188 and a driving belt 190. The ballscrew 192 is disposed on the main body portion 142 such that the ballscrew 192 is rotatable about its vertical axis relative to the main body portion 142, but is axially immovable relative to the main body portion 142. The ballscrew 192 is held in engagement with a ballnut 194 fixed to the vertically movable member 180, so that the vertically movable member 180 is vertically moved when the ballscrew 192 is rotated by the vertical drive motor 184. The vertical movement of the vertically movable member 180 is guided by a guide member in the form of a guide rod 196. The driving pulley 186 and the driven pulley 188 are timing pulleys, while the driving belt 190 is a timing belt.

The nozzle holder 172 includes a rod 200, which is supported by the vertically movable member 180 such that the rod 200 is rotatable about its vertical axis relative to the vertically movable member 180 but is axially immovable relative to the member 180. The holder rotating device 176 includes a drive source in the form of a rotary drive motor 202, and a rotation transmitting device including a driving gear 204 and a driven gear 206. A rotary motion of the rotary drive motor 202 is transmitted to the rod 200 through the rotation transmitting device 202, 204.

The suction nozzle 170 is removably attached to a lower end portion of the rod 200 which extends downwards from the vertically movable member 180. The suction nozzle 170 is rotated about its vertical axis when the rod 200 is rotated. When the rod 200 is vertically moved with the vertically movable member 180, the suction nozzle 170 is vertically moved with the rod 200. The suction nozzle 170 has a suction tube 210 to which a negative pressure is applicable from a negative-pressure source (not shown) through a vacuum passage 212 formed through the rod 200, and vacuum passages (not shown) formed through the vertically movable member 180, etc. The suction tube 210 is operable to hold the component 16 by suction under the negative pressure. To the suction tube 210, there is attached a circular reflecting plate 214. In the illustrated embodiment, the suction nozzle 170 is located at a position on the X-axis slide 126, which is relatively near the component supplying device 20.

Figure 6:
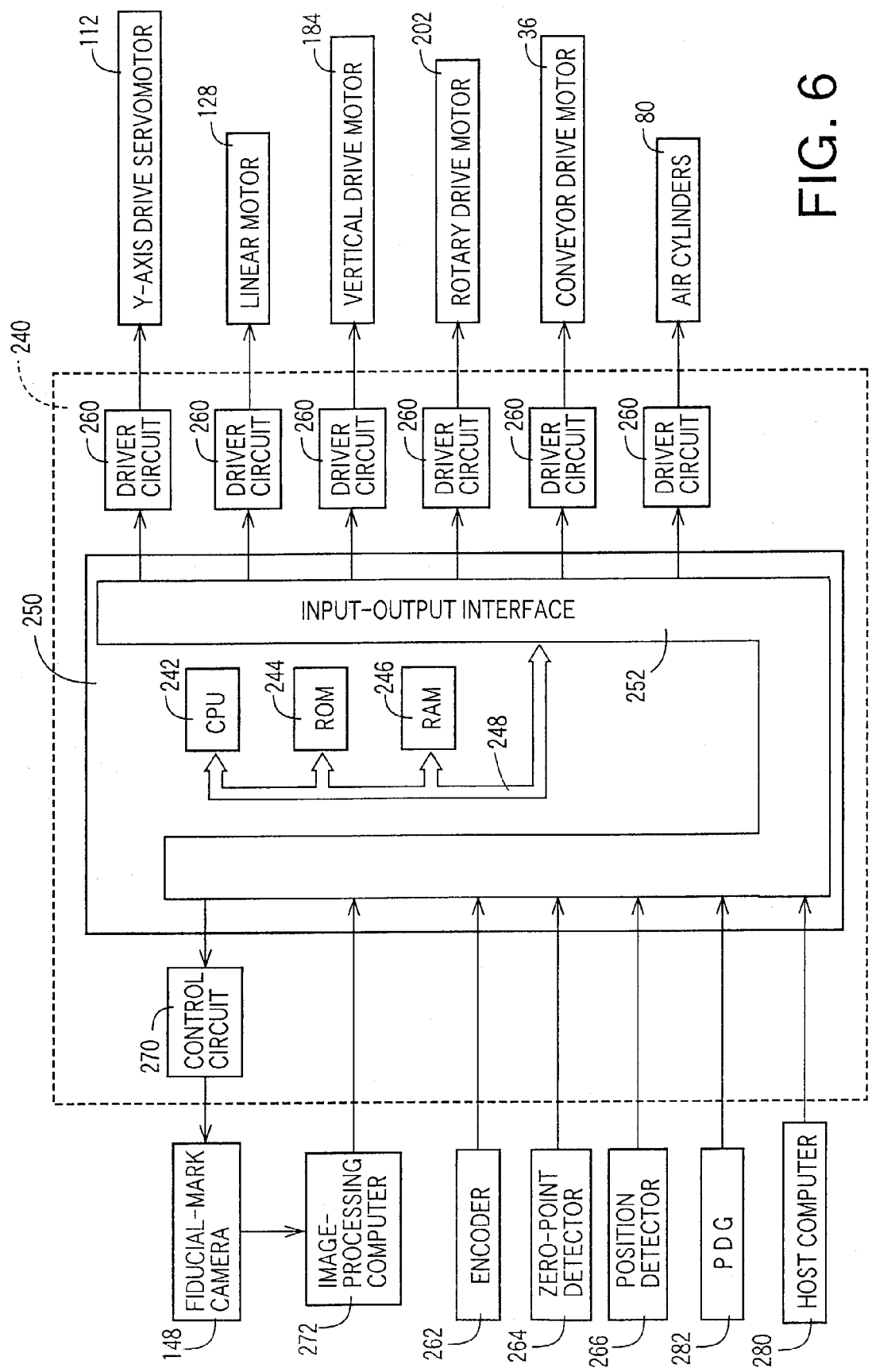
FIG. 6 is a block diagram schematically illustrating a control device of the above-indicated electronic-circuit-component mounting system.

The present electronic-circuit-component mounting system includes a plurality of control devices 240, one of which is schematically shown in FIG. 6. The control devices 240 are provided for the respective component mounting units 100, and are arranged to control the component mounting units 100 independently of each other. Each control device 240 is principally constituted by a computer 250 incorporating a CPU (central processing unit) 242, a ROM (read-only memory) 244, a RAM (random-access memory), and a bus 248 interconnecting these elements. The computer 250 further incorporates an input-output interface 252, which is connected through driver circuits 260 to various actuators such as the Y-axis drive servomotor 112 and linear motor 128. Amounts of rotation of the drive motors such as the Y-axis drive servomotor 112, vertical drive motor 184 and rotary drive motor 202 are detected by encoders, the output signals of which are applied to the control device 240. In FIG. 6, only the encoder 262 for detecting the amount of rotation of the Y-axis drive servomotor 112 is shown by way of example.

A zero-point detector 264 and a position detector 266 are provided for detecting a zero point and a present position of the X-axis slide 126 positioned by the linear motor 128. Output signals of these zero-point detector 264 and position detector 266 are applied to the control device 240 through the input-output interface 252. To the input-output interface 252, there is also connected the fiducial-mark camera 148 through a control circuit 270. An image data indicative of images taken by the fiducial-mark camera 148 are processed by an image processing computer 272, and an output of the image-processing computer 272 is applied to the control device 240. To the input-output interface 252, there are also connected a host computer 280 and a parts data generator (PDG) 282. These host computer 280 and parts data generator 282 are connected to the control devices 240 for a group of component mounting units 100, so that information on the individual component mounting units 100 and information on the printed-wiring boards 12 (in particular, information on the fiducial marks 146) can be transmitted and received between the host computer 280 and the component mounting units 100, as needed. The ROM 244 and RAM 246 of the computer 250 are provided to store a main program, and various other control programs for controlling an operation of the corresponding component mounting unit 100.

There will be described an operation of the electronic-circuit-component mounting system constructed as described above. Since the component mounting operation of the system is similar to that in the prior art, only those aspects of the operation which relate to the principle of the present invention will be described in detail.

Initially, the printed-wiring board 12 on which the components 16 are to be mounted is transferred by the board conveyor 14 and is stopped by the stopper device of the board supporting device 42 corresponding to the board 12. Namely, the printed-wiring boards 12 are stopped in position at the corresponding component mounting units 100 such that a component mounting area of each printed-wiring board 12 in which the components 16 are mounted is aligned with, more precisely, located within the mounting area 102 (shown in FIG. 1) of the corresponding component mounting unit 100. In this specific example, the two printed-wiring boards 12 are positioned relative to the mounting areas 102 of the corresponding two component mounting units 100.

Then, each printed-wiring board 12 is elevated to its operating position, at which the board 12 is supported by the corresponding board supporting device 42. At this position, the components 16 are mounted on the board 12 by the component mounting device 18 of the system. Prior to the operations of the component mounting device 18, however, an operation to obtain a relative position between each component mounting unit 100 and the corresponding board 12 is performed.

The printed-wiring board 12 having the two fiducial marks 146 provided thereon is positioned such that the two fiducial marks 146 are located within the respective imaging areas of the fiducial-mark cameras 148 of the adjacent two component mounting units 100, and images of the two fiducial marks 146 are taken by the two fiducial-mark cameras 148. Positioning errors of the printed-wiring board 12 are obtained for each of the two adjacent component mounting units 100, on the basis of the positions of the two fiducial marks 146 obtained from the images taken by the fiducial-mark cameras 148, and stored information indicative of the predetermined relative position of the two adjacent component mounting units 100. This arrangement to obtain the positions of the two fiducial marks 146 rather than the position of one fiducial mark 146 permits higher degrees of accuracy of detection of the positioning errors (of the printed-wiring board 12, in particular, a higher degree of accuracy of detection of the angular positioning error of the board 12 relative to the component mounting units 100).

Initially, there will be described a relative-position detecting routine to be executed in the present electronic-circuit-component mounting system, as a routine to obtain information relating a relative position between the adjacent two component mounting units 100. This relative-position detecting routine is executed upon completion of a series of component mounting operations of the present electronic-circuit-component mounting system, or at a predetermined time of maintenance inspection of the system. The routine may be executed upon daily inspection of the system, or at a predetermined time interval during the series of component mounting operations. In the present example, each printed-wiring board 12 is positioned relative to the adjacent two component mounting units 100 such that the two units 100 cover respective parts of the component mounting area of the board 12, so that the component mounting operations of the two units 100 are concurrently performed on the thus positioned printed-wiring board 12. However, each printed-wiring board 12 having a relatively small size may be positioned in alignment with the corresponding component mounting unit 100, so that the component mounting operation of the unit 100 is performed in the component mounting area of the board 12. Alternatively, each printed-wiring board 12 having a relatively large size may be positioned such that the three or more units 100 cover respective parts of the component mounting area of the board 12, so that the component mounting operations of the three or more units 100 are concurrently operated on the board 12.

To begin with, the relative-position detecting routine will be only briefly described. In the present embodiment wherein the calibration marks 160 are provided on the machine base 10, each common mark 160a of the calibration marks 160 is located at the boundary between the imaging areas of the fiducial-mark cameras 148 of the adjacent two component mounting units 100, and each specific mark 160b is located at a midpoint of a straight segment connecting the adjacent two common marks 160a. On the basis of the images of the calibration marks 160 taken by the fiducial-mark cameras 148, the specific positions of the calibration marks 160 can be obtained in a specific coordinate system specific to each fiducial-mark camera 148, that is, specific to each of the adjacent two component mounting units 100.

Generally, the adjacent two component mounting units 100 have not only horizontal relative positioning errors in the horizontal XY plane, namely, in the X-axis and Y-axis directions, with respect to the nominal X-axis and Y-axis relative positions, but also an angular or rotational relative positioning error about the vertical or Z axis perpendicular to the XY plane, with respect to the nominal relative angular position. These horizontal positioning errors and angular or rotational positioning error are obtained as relative positions of the adjacent component mounting units 100, on the basis of the images of the common and specific marks 160a, 160b taken by the fiducial-mark camera 148 of each of the adjacent two component mounting units 100. The images of the marks 160a, 160b represent the positions of the fiducial-mark cameras 148 and therefore the positions of the adjacent two component mounting units 100 relative to the marks 160a, 160b.

Thus, the images of one common mark and one specific mark 160b corresponding to each unit 100 of a group of adjacent component mounting units 100 (adjacent two units 100 in this example) are taken by the fiducial-mark camera 148 of each of the adjacent units 100, and image data thus obtained by the fiducial-mark cameras 148 are sent to the image-data processing computer 272, and processed by this computer 272 to obtain the specific positions of the common and specific marks 160a, 160b corresponding to each unit 100, in the specific coordinate system specific to the corresponding fiducial-mark camera 148. The specific positions of the common and specific marks 160a, 160b taken for one of the adjacent two component mounting units 100 are supplied to the control device 240 for the other of the adjacent two units 100. Similarly, the specific positions of the common and specific marks 160a, 160b taken for the other unit 100 are supplied to the control device 240 for the above-indicated one unit 100. The control device 240 for each of the adjacent two units 100 obtains the horizontal and angular positioning errors of that unit 100 relative to the other unit 100, on the basis of the specific positions of the common and specific marks 160a, 160b taken in the specific coordinate system of the corresponding fiducial-mark camera 148, and the specific positions of the common and specific marks 160a, 160b which have been taken in the specific coordinate system of the camera 148 of the other unit 100 and which have been received from the control device 240 for that other unit 100.

Figure 7:
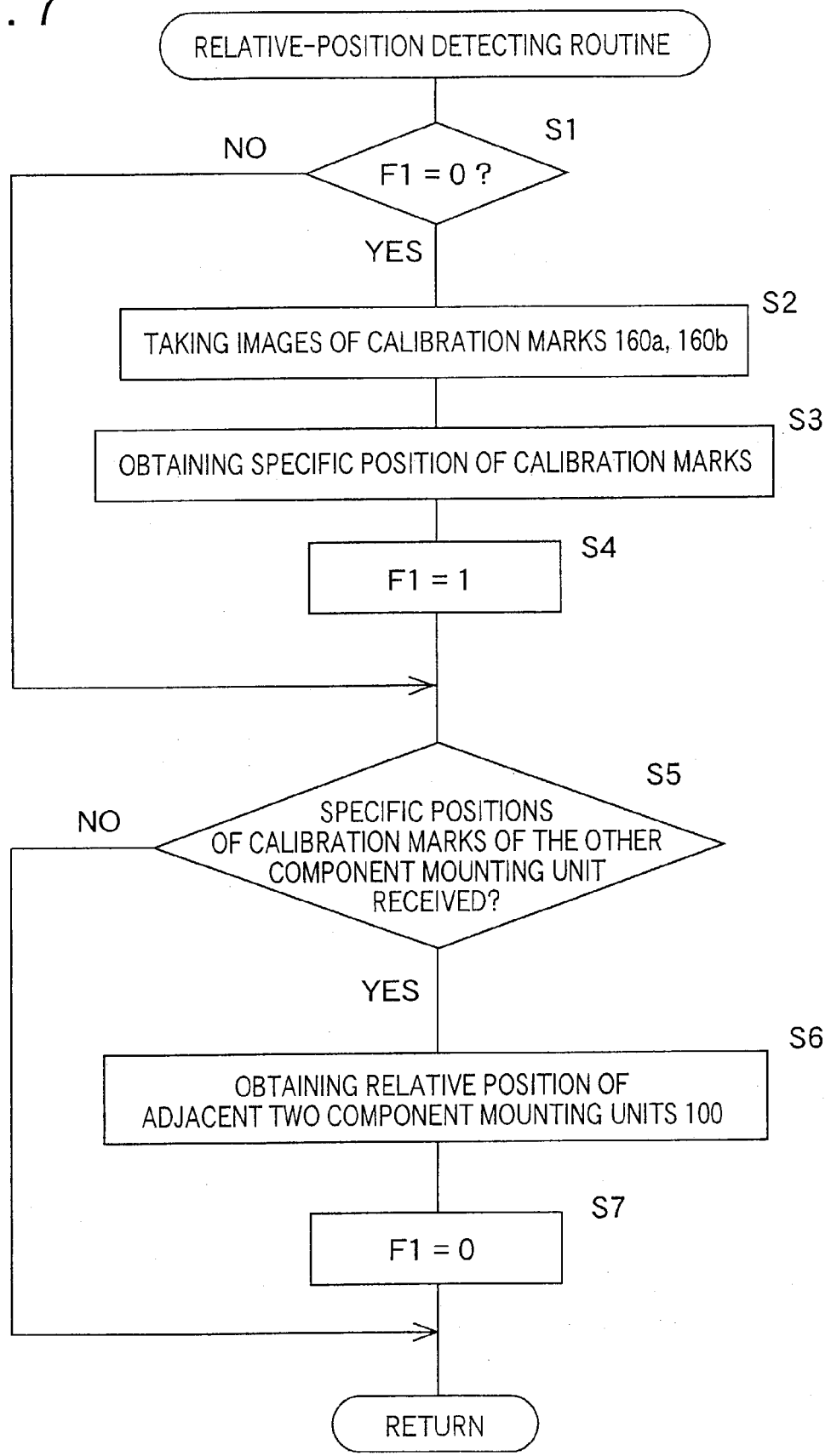
FIG. 7 is a flow chart illustrating a relative-position detecting routine executed by the above-indicated control device.

Referring next to the flow chart of FIG. 7, the relative-position detecting routine will be described in detail. The present relative-position detecting routine is initiated by the control device 240 for each component mounting unit 100, when a suitable manually operable member provided on an operator's control panel (not shown) is operated by the operator of the system. The content of this routine is identical for the adjacent two component mounting units 100. The routine will be described for one of the adjacent two units, namely, for the first component mounting unit 100, by way of example.

Figure 9:
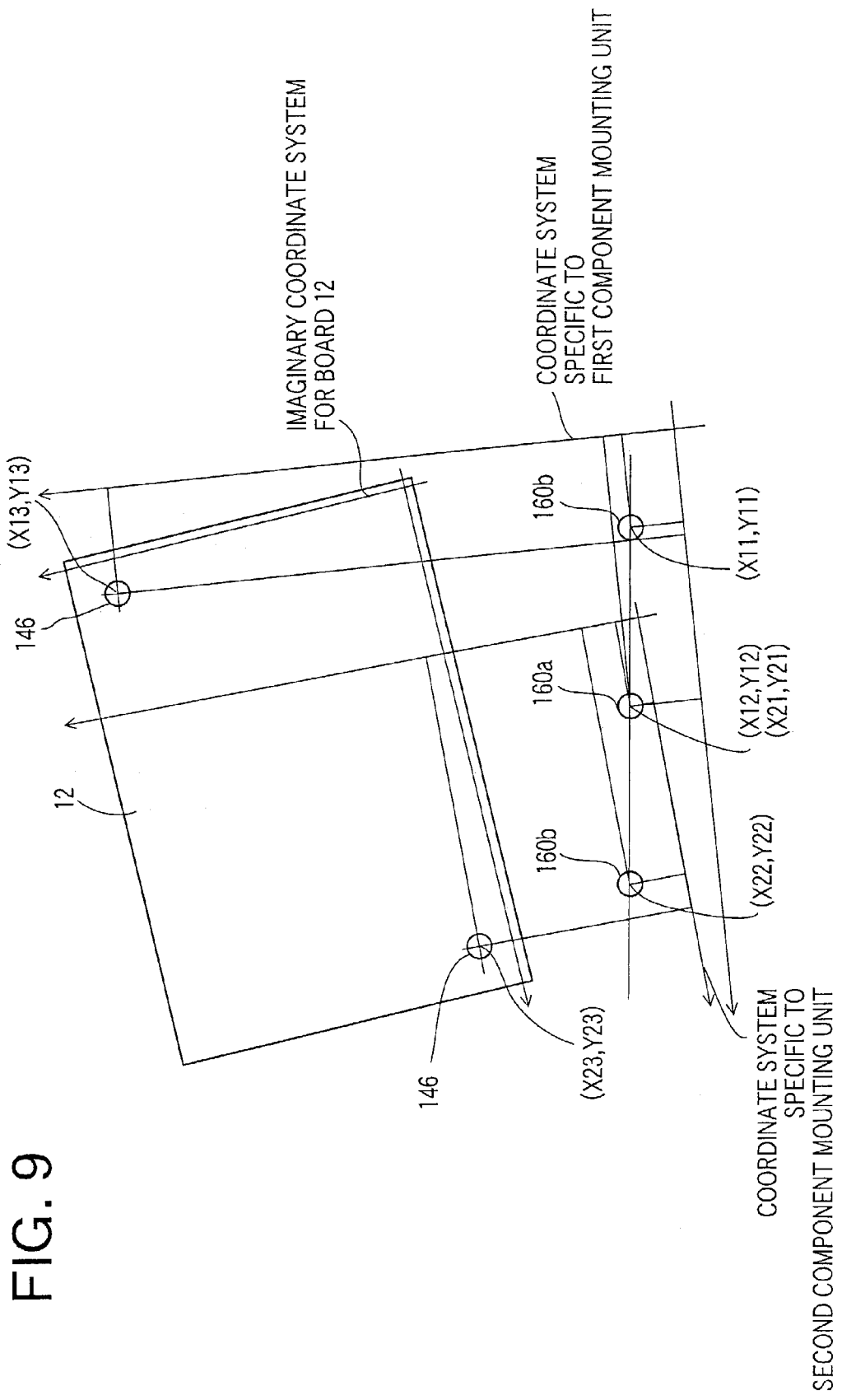
FIG. 9 is a view for explaining operations according to the above-indicated relative-position detecting routine and printed-wiring-board positioning-error detecting routine.

The relative-position detecting routine is initiated with step S1 to determine whether a flag F1 is set at "0". Since the flag F1 has been reset to an initial value "0", an affirmative decision (YES) is obtained in step S1 in the first cycle of execution of the routine, and the control flow goes to step S2 in which the images of the common mark 160a and the specific mark 160b are taken by the fiducial-mark camera 148 of the first component mounting unit 100. Step S2 is followed by step S3 in which the specific positions of the calibration marks 160a, 160b relative to the first unit 100 are obtained on the basis of the image data of the calibration marks 160a, 160b taken by the camera 148. Namely, the specific position (X12, Y12) of the common mark 160a and the specific position (X11, Y11) of the specific mark 160b are obtained, as indicated in FIG. 9. Information indicative of these specific positions is stored in the RAM 246 of the control device 240 for the first unit 100, and is transmitted through the host computer 280 to the control device 240 for the other of the adjacent two units 100, namely, for the second unit 100. In the control device 240 for the second unit 100, the specific positions (X12, Y12) and (X11, Y11) received from the control device 240 for the first unit 100 are stored in the RAM 246, according to an interruption processing. The control flow then goes to step S4 to set the flag F1 to "1", and then goes to step S5 to determine whether information indicative of the specific positions of the common and specific marks 160a, 160b for the second component mounting unit 100 has been received from the corresponding control device 240. Until an affirmative decision (YES) is obtained in step S5, that is, until the information has been received from the corresponding control device 240, steps S1 and S5 are repeatedly implemented, with steps S2–S4 being skipped.

In the second component mounting unit 100, too, the relative-position detecting routine is executed to obtain the specific positions (X21, Y21) and (X22, Y22) of the common and specific marks 160a, 160b for the second unit 100, and information indicative of these specific positions is transmitted through the host computer 280 to the control device 240 for the first unit 100. If this information has not been received by the control device 240 for the first unit 100, a negative decision (NO) is obtained in step S5, and one cycle of execution of the routine of FIG. 7 is terminated. If the information indicative of the specific positions (X21, Y21) and (X22, Y22) of the common and specific marks 160a, 160b has been received from the control device 240 for the second unit 100, the affirmative decision (YES) is obtained in step S5, and the control flow goes to step S6 to obtain the relative position between the two adjacent component mounting units 100 (first and second units 100), on the basis of the two pairs of specific positions (X12, Y12) and (X11, Y11), and (X21, Y21) and (X22, Y22) of the respective two pairs of common and specific marks 160a, 160b. The specific positions (X12, Y12) and (X21, Y21) are X-axis and Y-axis coordinate values of the same common mark 160a in the respective two specific coordinate systems specific to the respective first and second coordinate systems. Since the common mark 160a and the two specific marks 160b are located at the known positions lying on the straight line parallel to the X-axis direction, as described above, the relative position between the two specific coordinate systems corresponding to the adjacent two units 100 can be obtained on the basis of the thus obtained specific positions of those common and specific marks 160a, 160b.

Information indicative of the thus obtained relative position between the two specific coordinate systems is stored, as the relative position between the adjacent first and second component mounting units 100, in a programmable portion of the ROM 244 or a backed-up portion of the RAM 246, which portion is capable of holding the information even when the present electronic-circuit-component mounting system is turned off. Then, the control flow goes to step S7 to reset the flag F1 to the initial value "0", and one cycle of execution of the routine is terminated. This routine is executed by the control device 240 for each of the units 100, and the relative position between the adjacent units 100 is retained until it is updated on the basis of the images of the calibration marks 160*a*, 160*b* to be subsequently taken by the fiducial-mark cameras 148.

Then, there will be described a positioning-error detecting routine for detecting the positioning errors of the printed-wiring board 12. Initially, the routine will be only briefly described.

As described above, the printed-wiring board 12 is introduced into the system by the board conveyor 14, and positioned such that the component mounting areas of the adjacent two component mounting units 100 cover respective parts of the component mounting area of the board 12. In this position of the board 12, the two fiducial marks 146 are located within the respective imaging areas of the fiducial-mark cameras 148 of the adjacent two units 100. Images of these two fiducial marks 146 are taken by the respective fiducial-mark cameras 148, and the specific positions of the fiducial marks 146 are obtained on the basis of image data representative of the images taken. The image data obtained in the first component mounting unit 100 are transmitted through the host computer 280 to the control device 240 of the second component mounting unit 100, and the image data obtained in the second unit 100 are transmitted to the control device 240 of the first unit 100. The positioning errors of the printed-wiring board 12 are detected on the basis of the specific positions of the two fiducial marks 146 and the relative position between the adjacent two component mounting units 100 obtained and stored in the corresponding control devices 240. The two fiducial marks 146 provided on the board 12, which are located within the imaging areas of the respective fiducial-mark cameras 148 of the adjacent two units 100, will be hereinafter referred to as the "first fiducial mark 146" and the "second fiducial mark", respectively.

Figure 8:
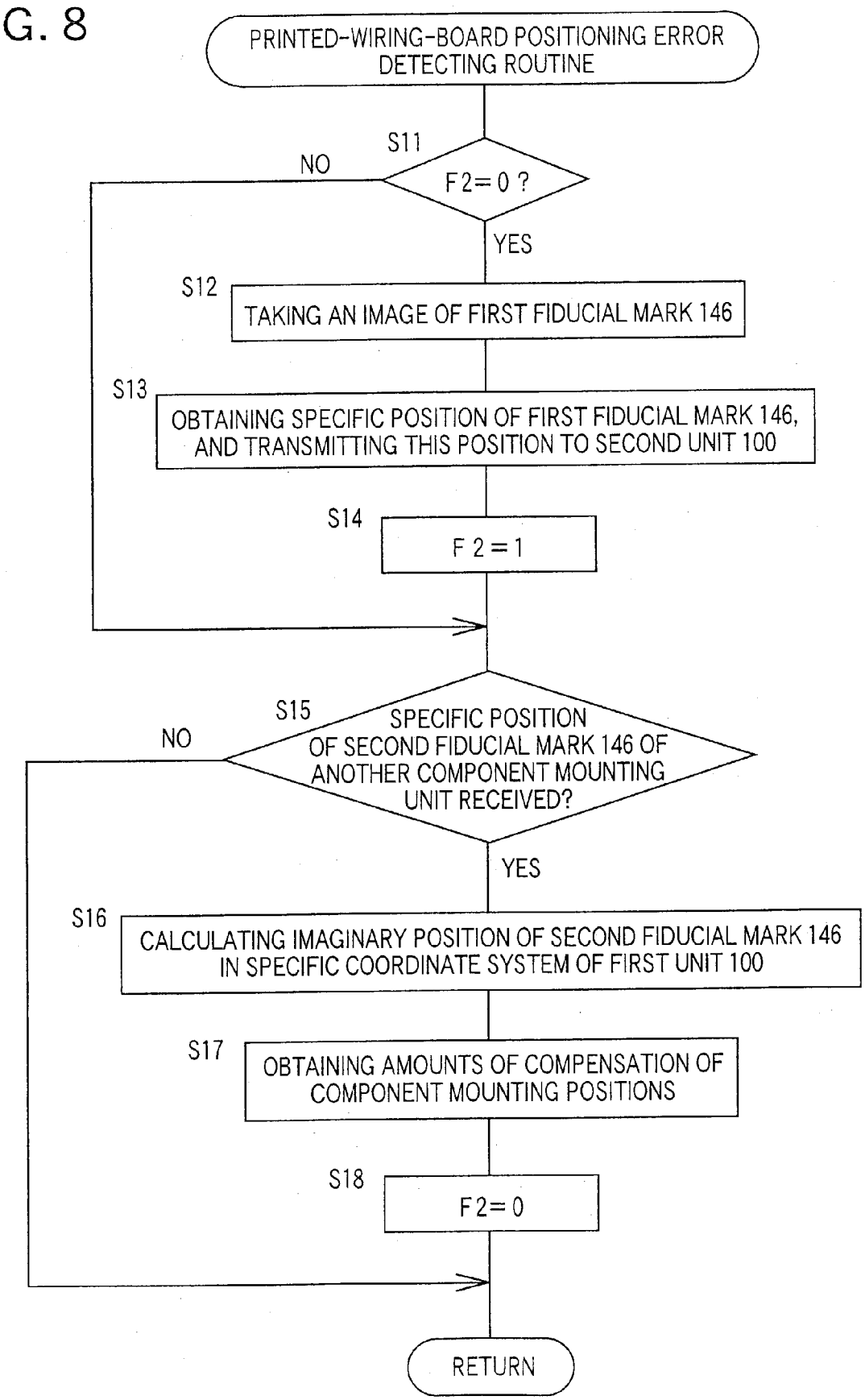
FIG. 8 is a flow chart illustrating a printed-wiring-board positioning-error detecting routine executed by the above-indicated control device.

Referring to the flow chart of FIG. 8, the positioning-error detecting routine will be described in detail. This positioning-error detecting routine is executed by the control device 240 of each of the adjacent first and second component mounting units 100 when each printed-wiring board 12 is loaded onto the system. The content of this routine is identical for the adjacent first and second component mounting units 100. The routine will be described for one of the first component mounting unit 100, by way of example. In the main control program, the loading of the printed-wiring board 12 into the predetermined position in the system is monitored, and the routine of FIG. 8 is initiated when the loading has been detected.

The positioning-error detecting routine is initiated with step S11 to determine whether a flag F2 is set at "0". Since the flag F2 was reset to its initial value "0", an affirmative decision (YES) is obtained in step S11 when this step is implement for the first time, and the control flow goes to step S12 to command the fiducial-mark camera 148 to take the image of the first fiducial mark 146. Step S12 is followed by step S13 to obtain a specific position of the first fiducial mark 146 on the basis of image data indicative of the image of the first fiducial mark 146, store the obtained specific position, and transmit information indicative of the obtained specific position to the control device 240 of the second component mounting unit 100. The control flow then goes to step S14 to set the flag F2 to "1" and then goes to step S15 to determine whether information indicative of the specific position of the second fiducial mark 146 has been received from the corresponding control device 240. Until an affirmative decision (YES) is obtained in step S15, that is, until the information has been received from the control device 240 of the second unit 100, steps S11 and S15 are repeatedly implemented, with steps S12–S14 being skipped. In the second component mounting unit 100, an operation to obtain the specific position of the second fiducial mark 146 is performed concurrently with the operation to obtain the specific position of the first fiducial mark 146 in the first unit 100. In the present example, the first fiducial mark 146 has the specific position (X13, Y13), while the second fiducial mark 146 has the specific position (X23, Y23), as indicated in FIG. 9. A negative decision (NO) is obtained in step S15 until the information indicative of the specific position (X23, Y23) of the second fiducial mark 146 has been received by the first unit 100. In this case, one cycle of execution of the routine is terminated, with the following steps S16–S18 being skipped. If the information of the specific position of the second fiducial mark 146 has been received by the first unit 100, the affirmative decision (YES) is obtained in step S15, and the control flow goes to step S16 to calculate an imaginary position (X23', Y23') of the second fiducial mark 146 in the specific coordinate system of the first unit 100. Described more specifically, the imaginary position (X23', Y23') is obtained on the basis of the already obtained relative position of the first and second units 100, and the specific position of the second fiducial mark 146.

Step S16 is followed by step S17 to calculate a relative position between the printed-wiring board 12 and the first unit 100, on the basis of the specific position (X13, Y13) of the first fiducial mark 146 and the imaginary position (X23', Y23') of the second fiducial mark 146, and calculate the amounts of compensation of each component mounting position of the mounting head 144 in the X-axis and Y-axis directions, on the basis of the calculated relative position between the board 12 and the first unit 100, so that the components 16 can be mounted by the mounting head 144, at the predetermined mounting positions on the board 12. Described more specifically, an imaginary coordinate system for the printed-wiring board 12 is determined on the basis of the specific position (X13, Y13) of the first fiducial mark 146 and the imaginary position (X23', Y23') of the second fiducial mark 146, and a relative position between the imaginary coordinate system of the board 12 and the specific coordinate system of the first unit 100 is calculated. On the basis of the thus calculated relative position, the component mounting position of the mounting head 144 is calculated. Where the dimensional errors of the printed-wiring board 12 due to its elongation and contraction in the X-axis and Y-axis directions are negligibly small, the imaginary coordinate system of the board 12 is considered to be the same as a nominal coordinate system set for the board 12 of the nominal dimensions. In this case, the amounts of compensation of each predetermined component mounting position of the mounting head 144 are determined on the basis of the horizontal positioning errors and the angular positioning error of the board 12 in the nominal coordinate system of the board 12 with respect to the specific coordinate system of the first unit 100. Where the dimensional errors of the board 12 due to its elongation and contraction are not negligibly small, the amounts of elongation and contraction in the X-axis and Y-axis directions in the nominal coordinate system should be taken into account. In any case, the amounts of compensation of each predetermined component mounting position of the mounting head 144 are calculated by conversion of the coordinate values of component mounting spots in the nominal coordinate system of the board 12 into the corresponding coordinate values in the specific coordinate system of the first unit 100, on the basis of the positioning error data of the board 12 suitably obtained in the specific case, and dimensional error data of the board 12 if necessary. The present printed-wiring-board positioning-error detecting routine is terminated with step S18 to reset the flag F2 to the initial value "0".

Subsequently, the components 16 are mounted on the board 12, at the respective predetermined mounting positions as compensated in step S17. In the present embodiment, the component mounting positions of the mounting head 144 are compensated for not only the positioning errors of the printed-wiring board 12, but also positioning errors of each component 16 as held on the mounting head 144. Since the compensation for the positioning errors of the components 16 does not relate to the present invention, no further description in this respect is deemed necessary.

While the detection of the positioning errors of the printed-wiring board 12 relative to the first component mounting unit 100 and the compensation of the component mounting positions of the mounting head 144 for the detected positioning errors of the board 12 have been described above, the detection of the positioning errors of the board 12 relative to the second component mounting unit 100 and the compensation of the component mounting positions for the detected positioning errors are effected in the same manner as described above with respect to the first unit 100. The operations of the first and second units 100 to mount the components 16 on the board 12 are concurrently performed according to a predetermined mounting program including position data indicative of the predetermined component mounting positions of the mounting head 144 for the respective components 16, such that the component mounting positions are compensated as described above.

It will be understood from the foregoing description of the present electronic-circuit-component mounting system that the fiducial marks 146 function as reference or fiducial portions of the board 12, while the fiducial-mark camera 148 of each component mounting unit 100 functions as a recognition device operable to recognize the fiducial portions of the board 12.

In the present electronic-circuit-component mounting system, the components 16 are mounted on the printed-wiring board 12 having a length in the X-axis direction, which is large enough to extend between the adjacent two component mounting areas of the two component mounting units 100. Before the adjacent two component mounting units 100 are operated to mount the components 16 on the board 12, the horizontal and angular positioning errors of the board 12 relative to each of the adjacent two units 100 are detected on the basis of the positions of the two fiducial marks 146 on the board 12, which are located in the respective mounting areas of the adjacent two units 100 (imaging areas of the fiducial-mark cameras 148) and which are imaged by the fiducial-mark cameras 148. In each component mounting unit 100, the fiducial-mark camera 148 is operated to detect the position of one of the two fiducial marks 146 which is located in the imaging area of the camera 148, and the control device 240 receives, from the other component mounting unit 100, information indicative of the position of the other fiducial-mark 146 detected by the fiducial-mark camera 148 in the other unit 100. On the basis of the detected positioning errors of the board 12, the predetermined mounting positions of the mounting head 144 at which the components 16 are mounted on the board 12 are compensated to permit the components 16 to be mounted at the predetermined mounting positions with high positioning accuracy. The present arrangement eliminates a need of positioning the board 12 with high accuracy relative to each component mounting unit 100, and therefore makes it possible to reduce the cost of manufacture of the electronic-circuit-component mounting system. Further, the present arrangement makes it possible to reduce the number of the fiducial marks 146 required to be provided on each board 12, and permits the fiducial marks 146 to be located at a desired position on the board 12, as long as the positions of the fiducial marks 146 are located within the imaging areas of the fiducial-mark cameras 148. Accordingly, the freedom of design of the printed-wiring board 12 with the fiducial portions (fiducial marks 146) is increased.

The present embodiment is arranged to actually detect the relative position between the adjacent component mounting units 100, the detection of this relative position is not essential where the errors of relative positioning of the component mounting units 100 are negligibly small. In this case, the predetermined relative positions of the component mounting units 100 are stored in a suitable memory of the control devices 240, and are read out when the positioning errors of the board 12 are detected.

Even where the relative positions of the component mounting units 100 are actually detected, this detection may be made at an opportunity different from that of the present embodiment, for example, when each printed-wiring board 12 is transferred. In this case, the detection may be made before or after the operation to take the images of the fiducial marks 146 on the board 12, or after the specific positions of the fiducial marks 146 have been obtained.

Further, the relative positions of the component mounting units 100 can be detected, without using the calibration marks 160, by using a suitable physically measuring instrument such as an instrument using a laser beam.

Although the component mounting units 100 are provided with the respective control devices 240, a single control device may be provided commonly for the individual component mounting units 100. In this case, the single control device is operated to execute the routines of FIGS. 7 and 8 for each of the plurality of units 100. In the present embodiment, the control devices 240 of the component mounting units 100 are connected to each other through the host computer 280, so that the information indicative of the specific position of the fiducial mark 146 obtained in each unit 100 is transmitted to the adjacent unit 100 through the host computer 280. However, the control devices 240 may be arranged to be able to effect direct mutual data communication.

Figure 10:
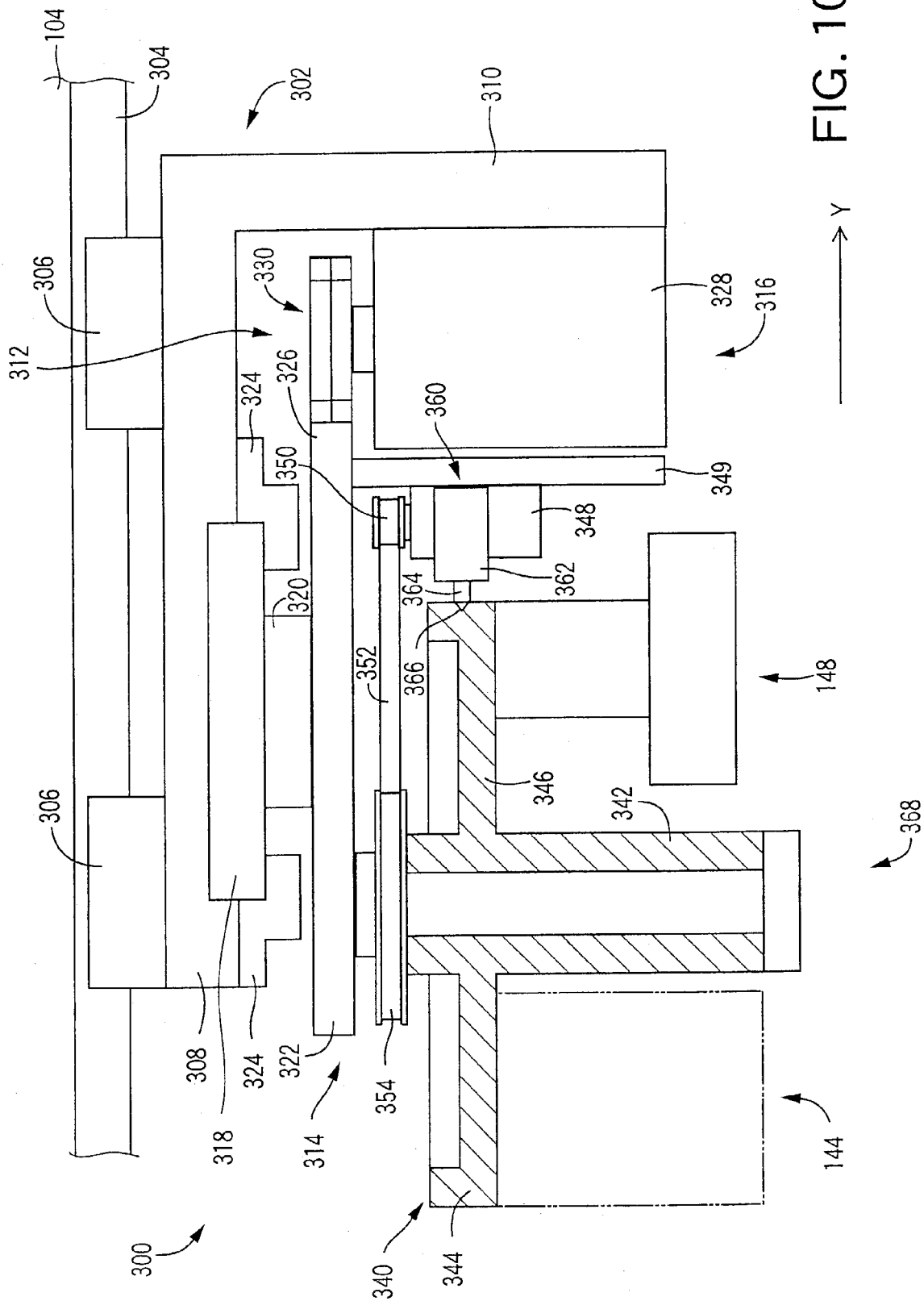
FIG. 10 is a front elevational view (partly in cross section) showing a major portion of a component mounting unit of an electronic-circuit-component mounting system according to another embodiment of the present invention.
Figure 11:
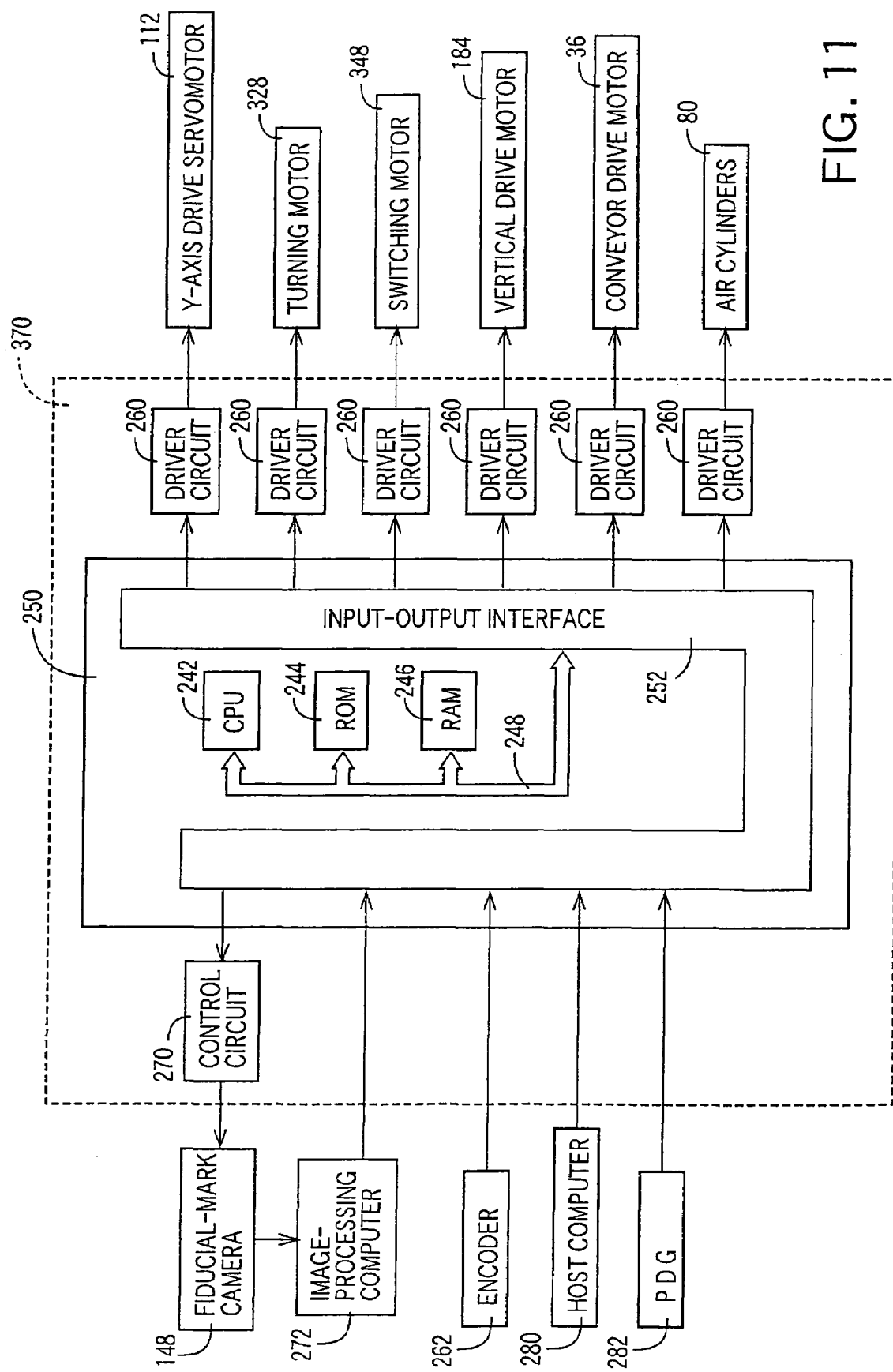
FIG. 11 is a block diagram schematically illustrating a control device of the above-indicated electronic-circuit-component mounting system.

Referring next to FIGS. 10 and 11, there will be described an electronic-circuit-component mounting system constructed according to another embodiment of this invention. The system according to this second embodiment is different from the system of the first embodiment, in the construction of each component mounting unit, and is identical with the system of the first embodiment in the other aspects. The same reference signs as used in the first embodiment will be used to identify the same elements, which will not be described. Only the aspects of the second embodiment different from the first embodiment will be described in detail.

The present system includes a plurality of component mounting units 300, each of which has the main body 104 extending in the Y-axis direction as in the first embodiment. Each component mounting unit 300 includes a Y-axis slide 302 movable in the Y-axis direction by rotation of the ballscrew 106 by the Y-axis drive servomotor 112. As in the first embodiment, the ballscrew 106 is fixed to the underside of the main body 104, and is held in engagement with a nut (not shown). The Y-axis slide 302 is fixed to a pair of guide blocks 306 which slidably engage guide rails 304 of the main body 104, so that the Y-axis slide 302 is held in slidable engagement with the guide rails 304 through the guide blocks 306.

As shown in FIG. 10, the Y-axis slide 302 of each component mounting unit 300 is L-shaped in transverse cross section, and has a horizontal first portion 308 in the form of a plate, and a vertical second portion 310 extending downwards from one end of the first portion 308. The Y-axis slide 302 is supported by the guide blocks 306 at its first portion 308. To the underside of the first portion 308, there is mounted a turning device 312 which supports the mounting head 144 such that the mounting head 144 is rotatable about its vertical axis of rotation.

The turning device 312 includes a pivotal member 314, and a drive device 316 operable to pivot the pivotal member 314. The pivotal member 314 includes a supported portion 318 in the form of a circular disc, a shaft portion 320 formed coaxially with the supported portion 318 and extending downwards from the supported portion 318, and a pivotal portion 322 in the form of an elongate plate fixed to the lower end of the shaft portion 320. The pivotal portion 322 has a width smaller than that of the main body 104. The supported portion 318, shaft portion 320 and pivotal portion 322 are formed integrally with each other. The pivotal member 314 is rotatably supported at its supported portion 318 by supporting members 324 attached to the underside of the first portion 308. The pivotal portion 322 has a part-cylindrical surface at one of its longitudinal ends (at its right end as seen in FIG. 10), which part-cylindrical surface is formed along a part of a cylinder having an axis on the axis of rotation of the shaft portion 320. The pivotal portion 322 has a sector gear 326 having a plurality of teeth formed on the part-cylindrical surface.

The drive device 316 includes a turning motor 328 which is held by the second portion 310 of the Y-axis slide 302 and which is provided with a scissors gear 330 meshing with the sector gear 326 of the pivotal member 314. The scissors gear 330 includes a pair of spur gears and an elastic member which gives a relative moment to the spur gears. In this arrangement of the drive device 316, the pivotal member 314 is pivotable about the axis of rotation of the shaft 320 over a predetermined angular range, by a rotary motion of the turning motor 328. The turning motor 328 is a servomotor which is operable in opposite directions and the operating amount of which can be accurately controlled.

To the other end portion of the pivotal portion 322 remote from the sector gear 326, there is mounted a rotary member 340 such that the rotary member 340 is rotatable about its vertical axis. The rotary member 340 includes a cylindrical main body portion 342, and a pair of arm portions 344, 346 which extends from the main body portion 342 in respective diametrically opposite radial directions of the main body portion 342. The rotary member 340 is rotated by a drive source in the form of a switching motor 348 fixedly mounted on a supporting member 349 which extends downwards from the lower surface of the pivotal member 314. The rotary member 340 is rotated about its vertical axis by the switching motor 348, through a driving pulley 350 connected to the switching motor 348, a driven pulley 354 connected to the rotary member 340, and a timing belt 352 connecting the driving and driven pulleys 350, 354.

The mounting head 144 and the fiducial-mark camera 148 are attached to the undersides of the respective arms 344, 346, such that a distance between the axis of rotation of the rotary member 340 and the gravity center of the mounting head 144 is substantially equal to a distance between the axis of rotation of the rotary member 340 and the gravity center of the fiducial-mark camera 148. The mounting head 144 and the fiducial mark camera 148 have the same constructions as in the first embodiment.

On the supporting member 349, there is also fixedly mounted a positioning device 360 provided to maintain hold or lock the rotary member 340 in one of two predetermined angular positions in which the arms 344, 346 extend in the longitudinal direction of the pivotal portion 322 of the pivotal member 314. Usually, the pivotal member 314 is held in a position in which the pivotal portion 322 extends in the Y-axis direction while the arms 344, 346 also extend in the Y-axis direction where the rotary member 340 is placed in one of the above-indicated two angular positions. In the angular position of the rotary member 340 shown in FIG. 10, the mounting head 144 attached to the arm 344 is placed in its operating position while the fiducial-mark camera 148 is placed in its non-operating or standby position. When the pivotal member 314 is pivoted by the drive device 316, the arm 344 of the rotary member 340 is moved along a circular arc having the center at the axis of pivoting of the pivotal member 314 (at the axis of rotation of the shaft portion 320). Where the fiducial-mark camera 148 is placed in its operating position with the rotary member 340 placed in the other angular position, a pivotal motion of the pivotal member 314 causes a movement of the fiducial-mark camera 148 along the above-indicated circular arc.

The positioning device 360 includes a solenoid 362, and a positioning pin 364 extending from the end face of the solenoid 362 in the radial direction of the rotary member 340 toward the rotary member 340. On the other hand, the arm portions 344, 346 have respective positioning holes 366 formed in their end faces such that the positioning pin 364 is engageable with a selected one of the two positioning holes 366. Normally, the positioning pin 364 is held in engagement with the selected one of the positioning holes 366 formed in the arm portions 344, 346, for holding the rotary member 340 in one of the above-indicated two angular positions relative to the pivotal member 314, to hold the mounting head 144 or the fiducial-mark camera 148 in its operating position. When the solenoid 362 is energized, the positioning pin 364 is disengaged from the positioning hole 366, and the rotary member 340 is permitted to be rotated by the drive device 316. The positioning pin 364 has a tapered or conical end portion, while the positioning holes 366 are tapered, so that the rotary member 340 can be accurately positioned at one of the two angular positions, by engagement of the positioning pin 364 with the corresponding positioning hole 366, with the solenoid 362 held in the de-energized state. While the positioning pin 364 is held in engagement with the selected one of the positioning holes 366, the switching motor 348 is held off.

In the component mounting unit 300 constructed as described above, the mounting head 144 and the fiducial-mark camera 148 are selectively placed in one and the other of the operating and non-operating positions which are relatively distant and near the axis of pivoting of the pivotal member 314, respectively. In other words, a selected one of the mounting head 144 and the fiducial-mark camera 148 which are mounted on the rotary member 340 is brought into the operating position by the switching motor 348, and is held in the operating position by the positioning device 360. It will be understood that the rotary member 340, the switching motor 348 and the positioning device 360 cooperate to constitute a switching device 368 operable to selectively place the mounting head 144 and the fiducial-mark camera 148 in the operating position.

In the present electronic-circuit-component mounting system, too, the individual component mounting units 300 are controlled by respective control devices 370. However, the detection of the relative positions of a group of adjacent component mounting units 300 and the detection of the positioning errors of the printed-wiring board 12 relative to each unit 300 are effected by the host computer 280 provided commonly for the units 300. Like the control device 240 in the first embodiment, the control device 370 of each unit 300 is principally constituted by the computer 250 incorporating the CPU 242, ROM 244, RAM 246, bus 248 and input-output interface 252. To the input-output interface 252, there are connected through the driver circuits 260 various actuators of each component mounting unit 300, such as the Y-axis drive servomotor 112, turning motor 328 and switching motor 248. To the input-output interface 252, there is also connected through the control circuit 270 the fiducial-mark camera 148. Further, the image-processing computer 272 is connected to the input-output interface 252, so that image data obtained by the fiducial-mark camera 148 are processed by the computer 272 and supplied to the computer 250. The ROM 244 or RAM 246 of the computer 250 stores various control programs such as a main control program, and various kinds of data relating to the printed-wiring board 12 and the components 16. To the input-output interface 252, there are also connected the common host computer 280 and the parts data generator (PDG) 282, from which each control device 370 receives necessary information such as the information on the board 12 and the components 16. The control devices 370 of the individual component mounting units 300 are all connected to the common host computer 280 and the parts data generator (PDG) 282, so that various kinds of data and commands can be transmitted and received between the host computer 280 and the control devices 370, as needed.

There will be described an operation of the electronic-circuit-component mounting system constructed as described above. The aspects of the operation of the present system which are similar to those in the first embodiment will be only briefly described, and the aspects different from those in the first embodiment will be described in detail.

In the present specific example, the adjacent three component mounting units 300 are concurrently operated to mount the components 16 in respective parts of the component mounting area of the printed-wiring board 12, which has a length in the X-axis direction sufficient to extend between the component mounting areas of the outer two units 300 of the adjacent three units 300. However, the present system is operable such that each component mounting unit 300 is operated to mount the components 16 on the board 12 whose component mounting area is smaller than the component mounting area of that unit 300, or such that the adjacent two units 300 are concurrently operated to mount the components 16 on the board 12, which has a length in the X-axis direction sufficient to extend between the component mounting areas of the adjacent two units 300.

In the present embodiment, the relative positions of the adjacent three component mounting units 300 of each group are detected with their fiducial-mark cameras 148 placed in their operating position, at a predetermined time of maintenance inspection of the system, upon changing of the printed-wiring board 12 from one kind to another, or at a predetermined time interval during a series of component mounting operations of the system. A variation in the relative position between the adjacent two units 300 due to thermal expansion of the various elements of the system can also be detected. Namely, when the printed-wiring board 12 is loaded onto the system, the positioning errors of the board 12 relative to each unit 300 are detected, before the components 16 are mounted on the board 12. Then, the switching motor 348 is operated to bring the mounting head 144 of each unit 300 into its operating position, and bring the fiducial-mark camera 148 into the non-operating or standby position. In this state, the operations of the adjacent three units 300 are concurrently operated to mount the components 16 in the respective parts of the component mounting area of the board 12.

The detection of the relative positions of the adjacent three component mounting units 300 is initiated with an operation to confirm that the fiducial-mark camera 148 of each unit 300 is placed in the operating position. In the present embodiment, the fiducial-mark cameras 148 are all placed in their operating position when the system is turned on. When the detection of the relative positions of the component mounting units 300 is initiated, at a certain point of time during interruption of a series of component mounting operations, either the mounting heads 144 or the fiducial-mark cameras 148 are placed in their operating position, depending upon the specific situation. Therefore, the detection of the relative positions of the units 300 is initiated with an operation to detect the presently established angular position of the rotary member 340, that is, to determine whether the fiducial-mark camera 148 of each unit 300 is presently placed in the operating position or the non-operating position. If the camera 148 is placed in the non-operating position, the rotary member 340 is rotated to bring the fiducial-mark camera 148 into the operating position. In the present embodiment, the determination as to whether the fiducial-mark camera 148 or the mounting head 144 is placed in the operating position is effected on the basis of an output of an encoder provided to detect the angular position of the switching motor 348. However, the determination may be effected by using a photoelectric sensor of light-reflection or light-transmission type arranged to detect a predetermined portion of the rotary member 340, which portion corresponds to the angular position of the rotary member 340 in which the mounting head 144 or the fiducial-mark camera 148 is placed in the operating position.

While the fiducial-mark camera 148 is placed in its operating position, the fiducial-mark camera 148 can be moved to a desired position within its imaging area, by a movement of the Y-axis slide 302 in the Y-axis direction and a pivotal movement of the pivotal member 314. Therefore, the calibration marks 160 provided on the machine base 10 can be imaged by the fiducial-mark cameras 148 of the adjacent component mounting units 300, as in the first embodiment. Image data representative of the images of the calibration marks 160 taken by the fiducial-mark camera 148 are supplied to the image-processing computer 272, and the image data processed by the computer 272 are supplied to the control devices 370. On the basis of the image data, the control devices 370 obtain the relative positions of the adjacent units 300. That is, the relative positions between the coordinate systems specific to the respective adjacent units 300 are obtained, as described below in detail.

After the printed-wiring board 12 is loaded onto the system and before the component mounting operations on the board 12 are initiated, the fiducial marks 146 located within the imaging areas of the respective fiducial-mark cameras 148 are imaged by the fiducial-mark cameras 148, and the positioning errors of the board 12 relative to each unit 300 are detected on the basis of the images of the fiducial marks 146. The operation to detect the positioning errors of the board 12 is performed in the substantially same manner as in the first embodiment, and no detailed explanation of this operation is deemed necessary. Briefly described, the positions of the images of the fiducial marks 146 taken by the fiducial-mark cameras 148 are obtained by the image-processing computer 272, and data indicative of these positions are supplied to the control devices 370. Each control device 370 obtains the positioning errors of the board 12 relative to the corresponding component mounting unit 300, on the basis of the position of the fiducial mark 146 whose image has been taken by the fiducial-mark camera 148 of that unit 300, and the imaginary positions of the fiducial marks 146 imaged by the fiducial-mark camera 148 of the other units 300. The amounts of compensation of the component mounting positions of the mounting heads 144 of the adjacent units 300 are calculated on the basis of the positioning errors of the board 12 relative to each unit 300. Subsequently, the switching motor 348 is operated to bring the mounting head 144 and the fiducial-mark camera 148 into the operating and non-operating positions, respectively, in each unit 300. In this state, the component mounting operations to mount the components 16 on the board 12 are performed. The mounting heads 144 are moved to the predetermined mounting positions as compensated, by movements of the Y-axis slides 302 and pivotal movements of the pivotal members 314 in the adjacent units 300, so that the components 16 are mounted at the respective predetermined mounting positions on the board 12.

The detection of the relative positions of the adjacent component mounting units 300 will be described in detail, by reference to the flow chart of FIG. 12. For simplification of the explanation, the units 300 do not have relative angular positioning errors and have only horizontal positioning errors. The relative-position detecting routine of FIG. 12 is executed by the host computer 280 for each of the adjacent three units 300, such that the routines for the respective units 300 are executed independently of each other.

Figure 12:
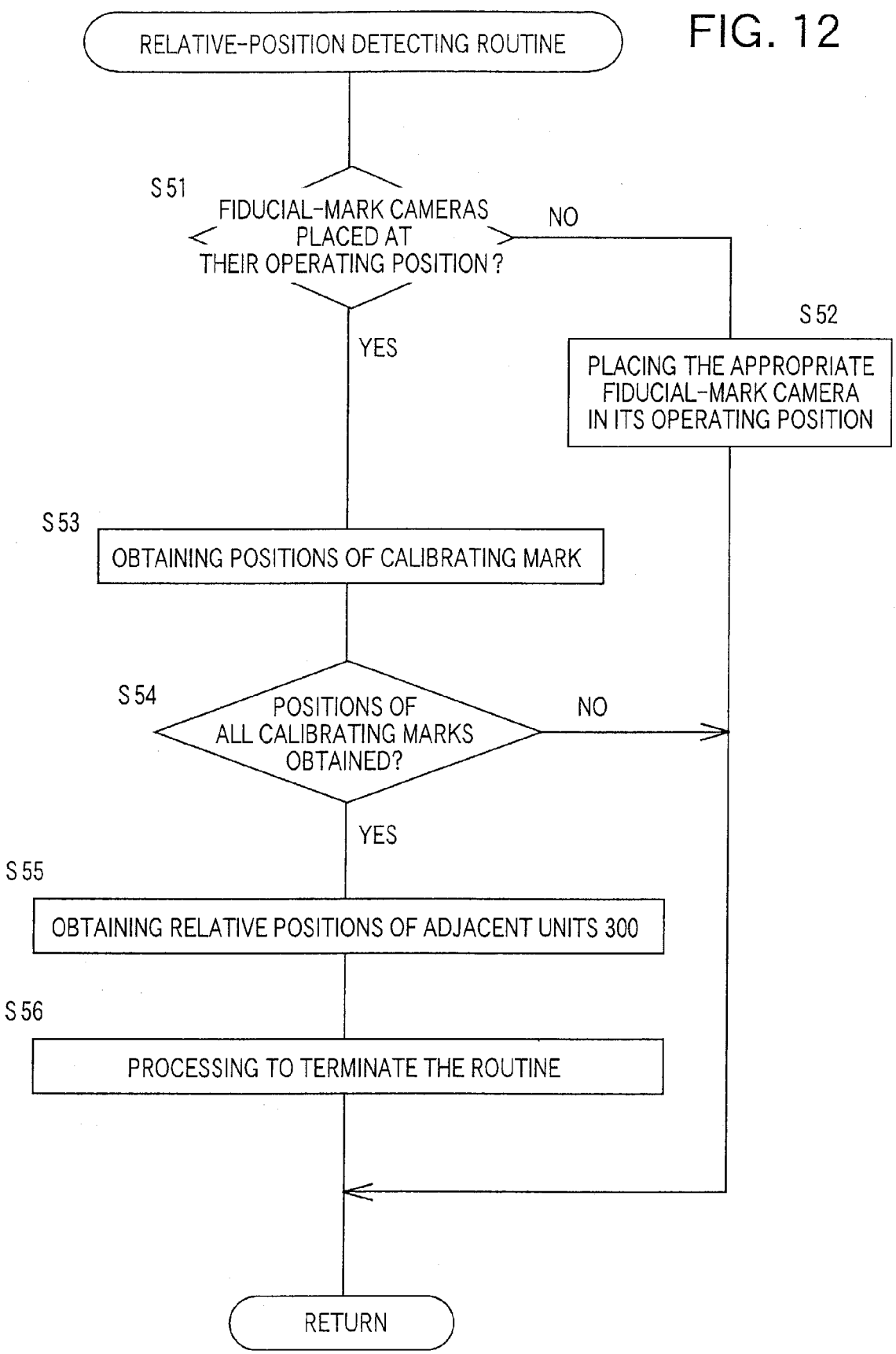
FIG. 12 is a flow chart illustrating a relative-position detecting routine executed by the above-indicated control device.
Figure 13:
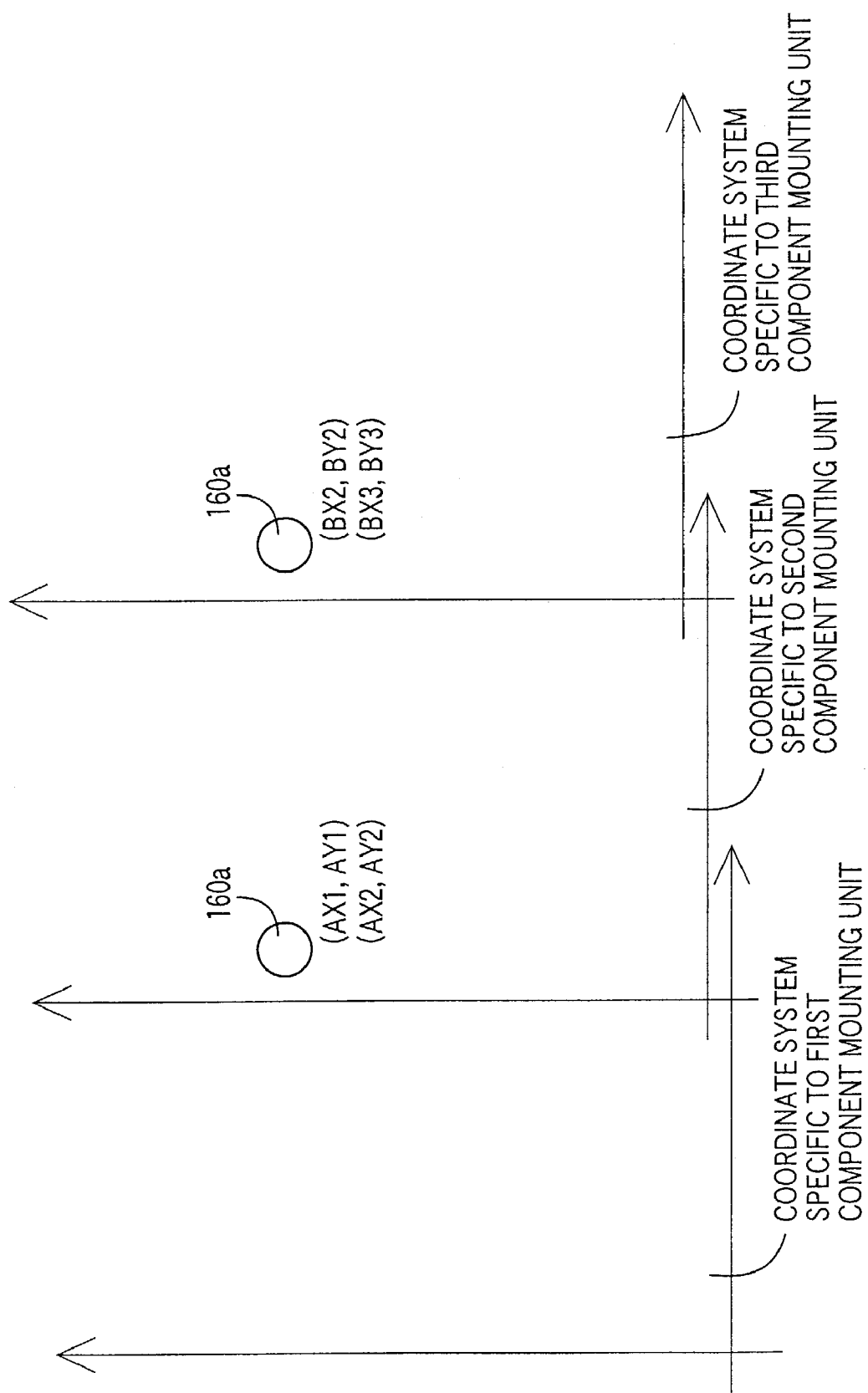
FIG. 13 is a view for explaining an operation according to the above-indicated relative-position detecting routine.

The relative-position detecting routine of FIG. 12 for each unit 300 is initiated with step S51 to determine whether the fiducial-mark camera 148 is placed in the operating position. To effect this determination, the host computer 280 request the computer 250 of each unit 300 to supply the host computer 280 with necessary information. In response to this request, the computer 250 of each unit 300 provides the host computer 280 with the information as to whether the fiducial-mark camera 148 is placed in the operating position or not. If any one of the fiducial-mark cameras 148 of the adjacent three units 300 is not placed in the operating position, a negative decision (NO) is obtained in step S51, and the control flow goes to step S52 in which the host computer 280 commands the appropriate computer 250 to operate the switching device 368 to bring the mounting head 144 and the fiducial-mark camera 148 into the non-operating and operating positions, respectively, so that the fiducial-mark camera 148 is placed in the operating position. If the fiducial-mark cameras 148 of all of the adjacent three units 300 are placed in the operating position, an affirmative decision (YES) is obtained in step S51, and the control flow goes to step S53. Steps S51 and S52 may be replaced by a step in which the host computer 280 commands the switching devices 368 to place the fiducial-mark cameras 148 of all the adjacent three units 300 in the operating position. Step S53 is provided to operate the fiducial-mark camera 148 of each unit 300 to take the image of the common calibration mark 160a. As a result, the first common mark 160a located between the adjacent first and second units 300 (most upstream and intermediate units 300 as viewed in the feeding direction of the board 12), and the second common mark 160a located between the adjacent second and third units 300 (intermediate and most downstream units 300) are sequentially imaged by the fiducial-mark cameras 148. For example, the fiducial-mark cameras 148 of the first and second units 300 are first operated to take the images of the first common mark 160a, and then the fiducial-mark cameras 148 of the second and third units 300 are operated to take the images of the second common mark 160a. This arrangement prevents an interference between the fiducial-mark cameras 148 of the adjacent units 300.

In the present embodiment, the fiducial-mark camera 148 of the second unit 300 is operated twice to take the images of the first and second common calibration marks 160a, 160a located on the opposite sides of the second unit 300, while the fiducial-mark camera 148 of each of the first and third units 300 is operated only once to take the image of the first or second common calibration mark 160a. However, the routine of FIG. 12 may be modified so as make it possible to take the images of the specific calibration marks 160b of the three adjacent units 300. In this case, the relative angular positioning errors of the first, second and third units 300 can be obtained, as well as the relative horizontal angular positioning errors of the units 300. A decision as to whether the images of the specific calibration marks 160b are also taken or not according to the routine of FIG. 12 may be made in a control routine (not shown) which controls the routine of FIG. 12. Image data thus taken by each fiducial-mark camera 148 are supplied to the image-processing computer 272, which processes the image data to obtain the position of the common mark 160a or positions of the common marks 160a in the specific coordinate system of each unit 300. Data indicative of the position or positions of the common mark or marks 160a are supplied to the host computer 280 through the computer 250. Step S53 is followed by step S54 to determine whether the positions of all of the common marks 160a (first and second common marks 160a indicated above) have been obtained. If a negative decision (NO) is obtained in step S54, one cycle of execution of the routine is terminated, with steps S55 and S56 being skipped. If an affirmative decision (YES) is obtained in step S54, the control flow goes to step S55 to obtain the relative positions of the adjacent three component mounting units 300.

In step S55, the specific position (AX1, AY1) of the first common mark 160a is obtained in the first unit 300, while the specific position (AX2, AY2) of the first common mark 160a is obtained in the second unit 300. Further, the specific position (BX2, BY2) of the second common mark 160a is obtained in the second unit 300 while the specific position (BX3, BY3) of the second common mark 160a is obtained in the third unit 300. On the basis of these obtained specific positions of the two common marks 160a, the relative horizontal positioning errors of the adjacent first, second and third units 300 are obtained. Described in detail, horizontal positioning errors ($\Delta$AX1, $\Delta$AY1) of the specific position (AX1, AY1) of the first common mark 160a obtained in the first unit 300 with respect to the stored nominal position of the first common mark 160a are obtained, and horizontal positioning errors ($\Delta$AX2, $\Delta$AY2) of the specific position (AX2, AY2) of the first common mark 160a obtained in the second unit 300 with respect to the stored nominal position are obtained. The positioning errors of the second unit 300 with respect to the first unit 300 are obtained as ($\Delta$AX2-$\Delta$AX1, $\Delta$AY2-$\Delta$AY1). Similarly, the positioning errors of the third unit 300 with respect to the second unit 300 are obtained as (($\Delta$BX3-$\Delta$BX2, $\Delta$BY3-$\Delta$BY2). On the basis of these relative positioning errors, the positioning errors of the third unit 300 with respect to the first unit 300 are obtained as {ΔBX3-ΔBX2-(ΔAX2-AAX1), ΔBY3-ΔBY2-(ΔAY2-ΔAY1)}. The relative positioning errors of the first, second and third units 300 represent the relative positions of these units 300.

After the relative positions of the adjacent three component mounting units 300 have been obtained in step S55, the control flow goes to step S56 to effect a predetermined processing operation for terminating the present routine of FIG. 12.

Before the components 16 are then mounted on the printed-wiring board 12, the images of the fiducial marks 146 are taken by the fiducial-mark cameras 148 of the component mounting units 300. On the basis of the images of the fiducial marks 146, the specific positions of the fiducial marks 146 are obtained, and the positioning errors of the printed-wiring board 12 relative to the three units 300 are obtained on the basis of the obtained specific positions of the fiducial marks 146 and the relative positioning errors of the three units 300. Then, the amounts of compensation of the component mounting positions at which the mounting heads 144 operate to mount the components 16 on the board 12 are calculated on the basis of the obtained positioning errors of the board 12, differences of the nominal positions of the second and third units 300 relative to that of the first unit 300, the obtained positioning errors of the second and third units 300 relative to the first unit 300, and the positioning errors of the components 16 as held by the mounting heads 144. The operations of the mounting heads 144 to mount the components on the board 12 are performed at the thus compensated component mounting positions, so that the components 16 are mounted at the predetermined positions on the board 12, with high positioning accuracy. Accordingly, the component mounting operations of the adjacent three component mounting units 300 can be performed according to the predetermined component mounting program including position data indicative of the component mounting positions of the mounting heads 144 predetermined for the respective components 16, such that the component mounting positions of the mounting heads 144 are compensated as described above.

It is noted that the switching device 368 in each component mounting unit 300 is operated to bring the mounting head 144 into its operating position, at a suitable point of time after the imaging of the calibration marks 160 by the fiducial-mark cameras 148. The operations of the mounting heads 144 to mount the components 16 on the board 12 are initiated after the compensation of the component mounting positions of the mounting heads 144 as described above.

In the present second embodiment, the host computer 280 provided commonly for all of the plurality of component mounting units 300 detects the relative positioning errors of the adjacent units 300 and the positioning errors of the printed-wiring board 12, and compensates the predetermined component mounting positions of the mounting heads 144. However, the computer 250 provided in each unit 300 may be assigned to effect at least one of the detection of the relative positioning errors of the adjacent units 300, the detection of the positioning errors of the board 12 and the compensation of the component mounting positions. In particular, it is effective to arrange the computer 250 to effect the compensation of the component mounting positions of the mounting head 144. While all of the plurality of component mounting units 300 are provided with the respective image-processing computers 272, a single common image-processing computer may be used commonly for all of the units 300.

Figure 14:
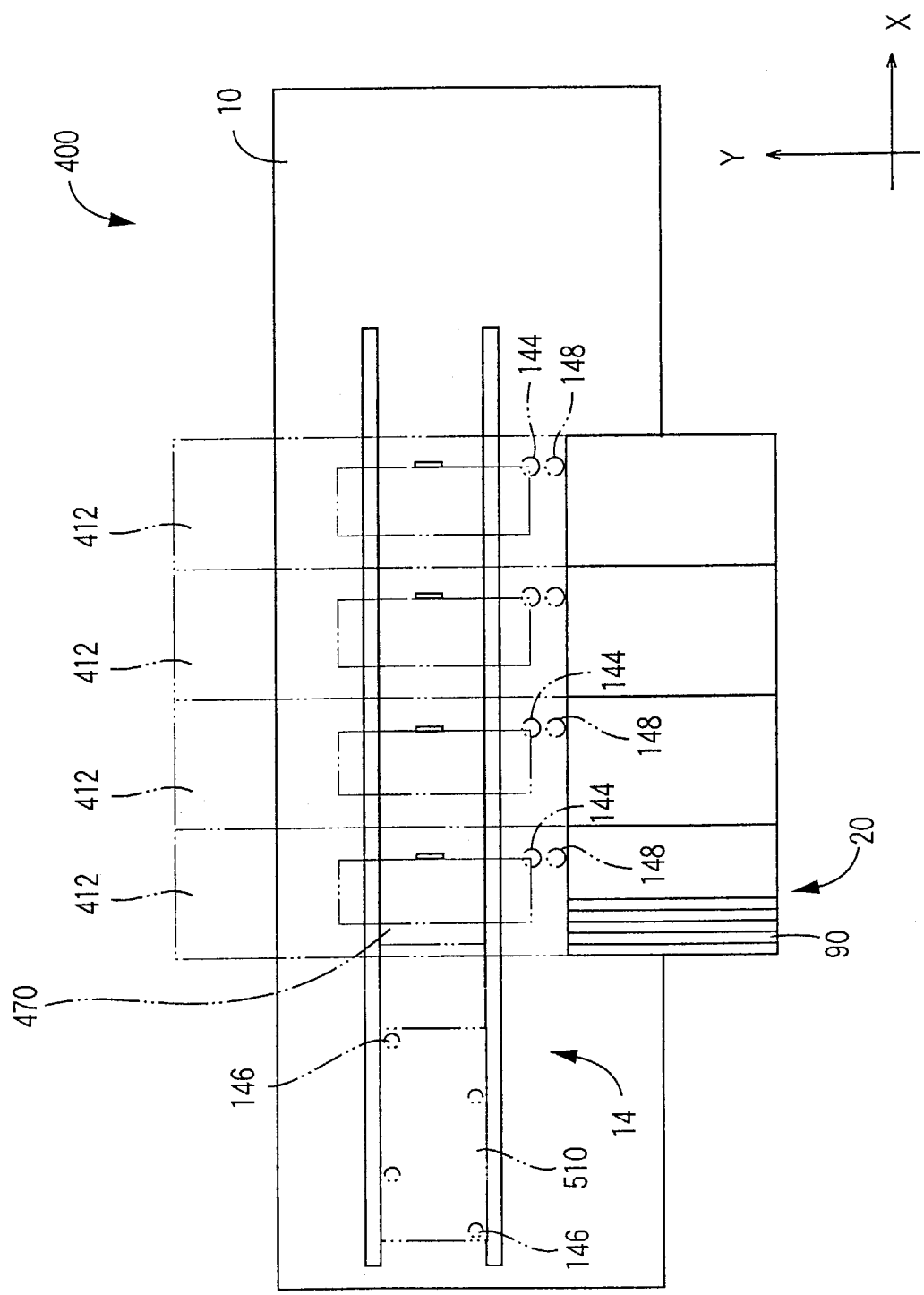
FIG. 14 is a plan view showing an electronic-circuit-component mounting system according to a further embodiment of this invention.
Figure 15:
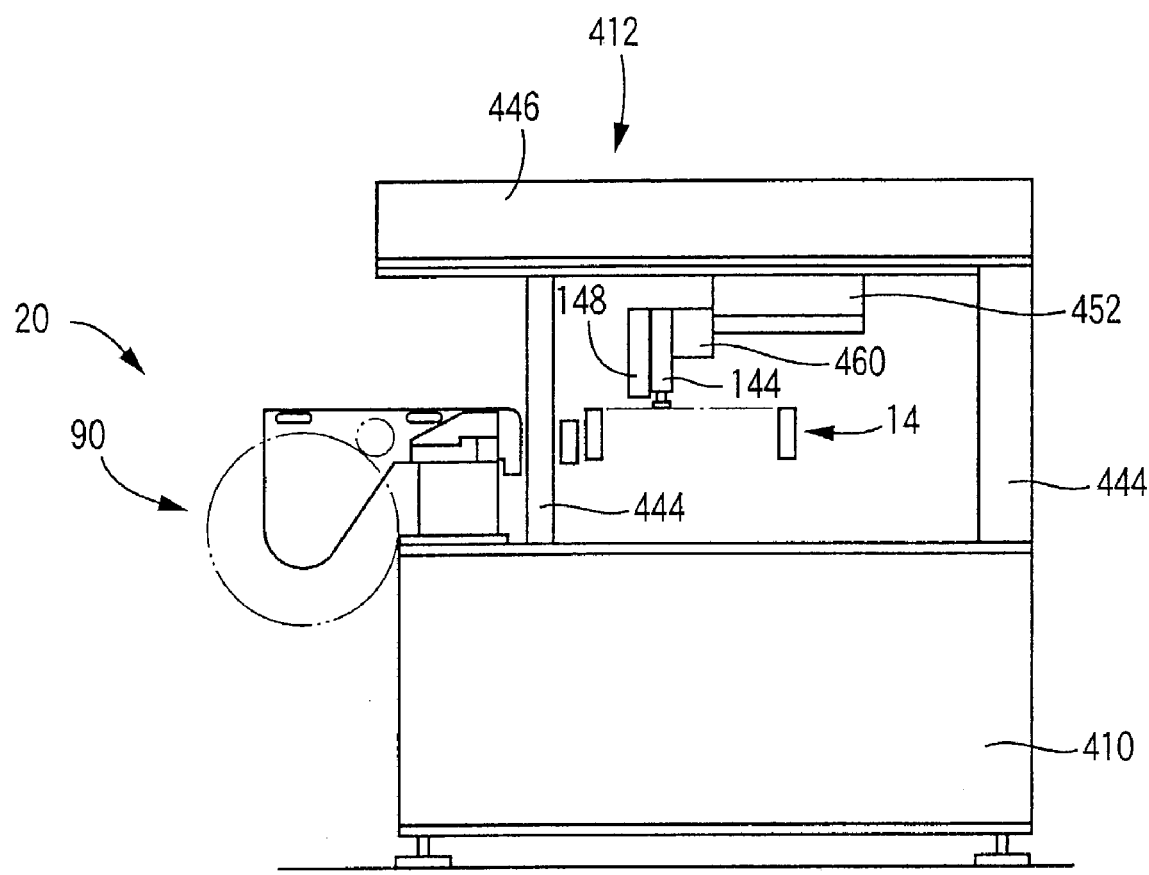
FIG. 15 is a side elevational view showing the above-indicated electronic-circuit-component mounting system.
Figure 16:
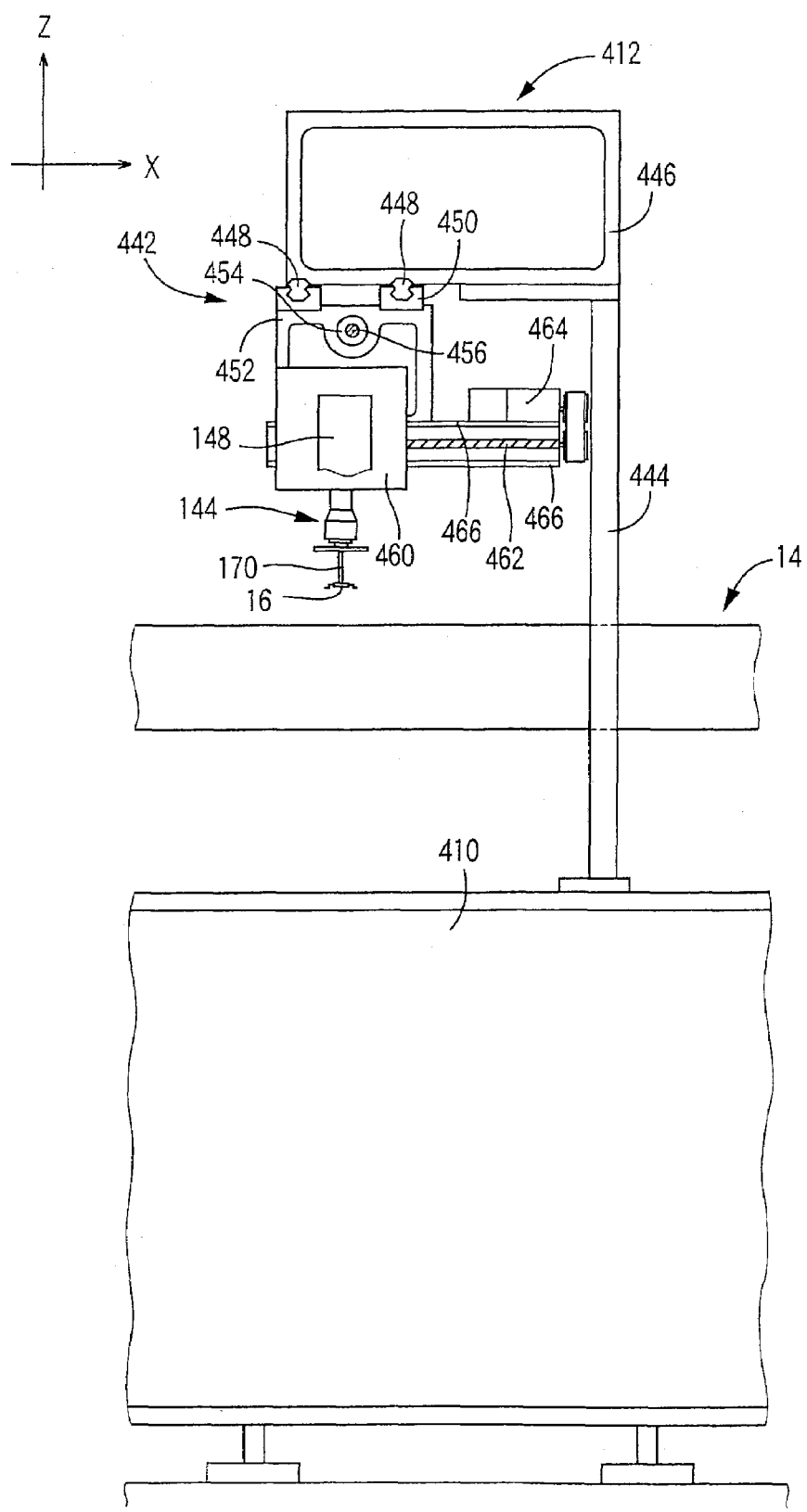
FIG. 16 is a front elevational view showing a major portion of the above-indicated electronic-circuit-component mounting system.

Referring to FIGS. 14–16, there will be described an electronic-circuit-component mounting system 400 constructed according to a third embodiment of this invention. The present system 400 also includes the board conveyor 14 and the component supplying device 20 disposed on the machine base 410, and further includes a plurality of component mounting units 412 arranged at a predetermined spacing pitch in the X-axis direction or the feeding direction of the printed-wiring board 12.

As shown in FIGS. 15 and 16, each component mounting unit 412 includes an XY drive device in the form of an XY robot 442 held by a frame 446 which is supported by support columns 444 extending upwards from the machine base 410. To the underside of the frame 446, there are fixed a pair of parallel guide rails 448 extending horizontally in the Y-axis direction. A Y-axis slide 452 is held in slidable engagement with the guide rails 448 through a pair of guide blocks 450. The Y-axis slide 452 has a ballnut 454 fixed thereto. The ballnut 454 is held in engagement with a feed screw in the form of a ballscrew 456 extending in the Y-axis direction. The Y-axis slide 452 is moved in the Y-axis direction when the ballscrew 456 is rotated by a drive source in the form of a Y-axis drive servomotor 458 (shown in FIG. 17). The ballnut 454, ballscrew 456 and Y-axis drive servomotor 458 constitute a Y-axis slide drive device, while the guide rails 448 and guide blocks 450 constitute a guide device for guiding the movement of the Y-axis slide 452.

An X-axis slide 460 is mounted on the Y-axis slide 452 such that the X-axis slide 460 is movable in the horizontal plane, in the X-axis direction perpendicular to the Y-axis direction. To the underside of the Y-axis slide 452, there is attached a ballscrew 462 which extends in the X-axis direction and which is held in engagement with a ballnut (not shown) fixed to the X-axis slide 460. The X-axis slide 460 is moved in the X-axis direction while being guided by guide rails 466, when the ballscrew 462 is rotated by an X-axis drive servomotor 464. The ballscrew 462, the ballnut engaging the ballscrew 462, and the X-axis drive servomotor 464 constitute an X-axis slide drive device, while the guide rails 466 function as a guide device for guiding the movement of the X-axis slide 460. Further, the Y-axis slide 452, X-axis slide 460, Y-axis slide drive device, X-axis slide drive device, and guide devices for the X-axis and Y-axis slides 452, 460 cooperate to constitute the XY robot 442.

The X-axis slide 460 carries the mounting head 144 and the fiducial-mark camera 148, which are movable in the XY plane by the XY robot 442. The mounting head 144 and fiducial-mark camera 148 have the same construction as described above.

As shown in FIG. 14, the mounting heads 144 of the plurality of component mounting units 412 are movable to desired positions within respective component mounting areas 470. In these component mounting areas 470, the mounting heads 144 can mount the components 16 at predetermined positions on the printed-wiring board 12 transferred by the board conveyor 14. In the present system 400, the component mounting areas 470 of the mounting heads 144 of the adjacent units 412 are spaced apart from each other in the X-axis direction by a predetermined spacing, which is equal to or slightly smaller than the width of each area 470.

Figure 17:
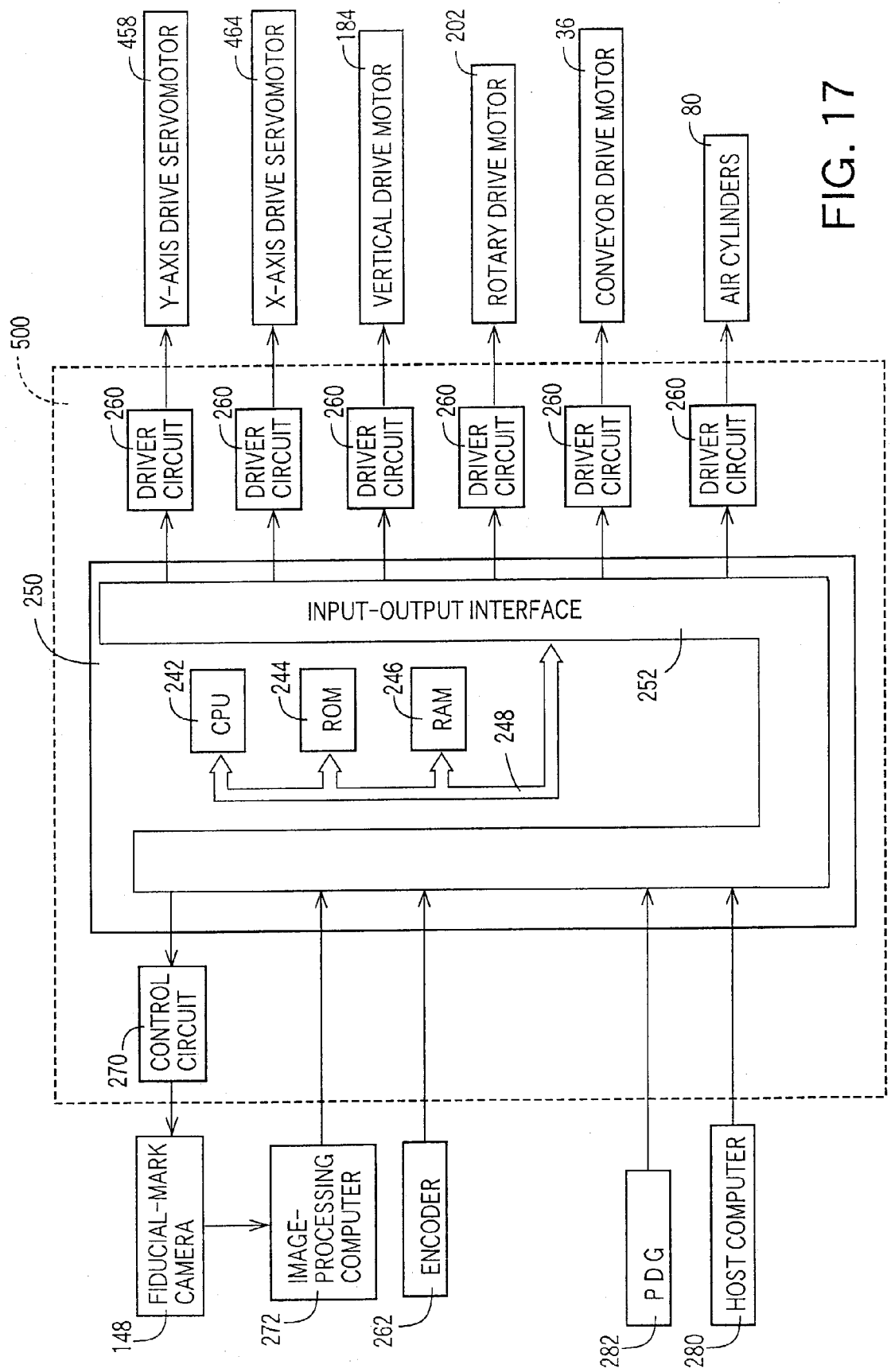
FIG. 17 is a block diagram schematically illustrating a control device of the above-indicated electronic-circuit-component mounting system.

The present system 400 includes a plurality of control devices 500 provided for controlling the respective component mounting units 412. One of the control devices 500 is shown in FIG. 17. Each control device 500 has an arrangement similar to that of the control devices 240, 370 described above. Briefly described, the control devices 500 for the respective component mounting units 412 are connected to each other, so as to permit data communication therebetween.

In the present embodiment wherein the component mounting areas 470 are spaced apart from each other in the X-axis direction, the component mounting units 412 are arranged without a spacing between the adjacent units 412 in the X-axis direction. Since the imaging areas in which the fiducial-mark cameras 148 are movable are spaced apart from each other in the X-axis direction, like the component mounting areas 470, it is impossible to obtain the relative positions of the component mounting units 412, by using the common calibration marks 160a used in the preceding embodiments. In the present embodiment, therefore, a fiducial board 510 is used to detect relative positioning errors of the units 412.

Figure 18:
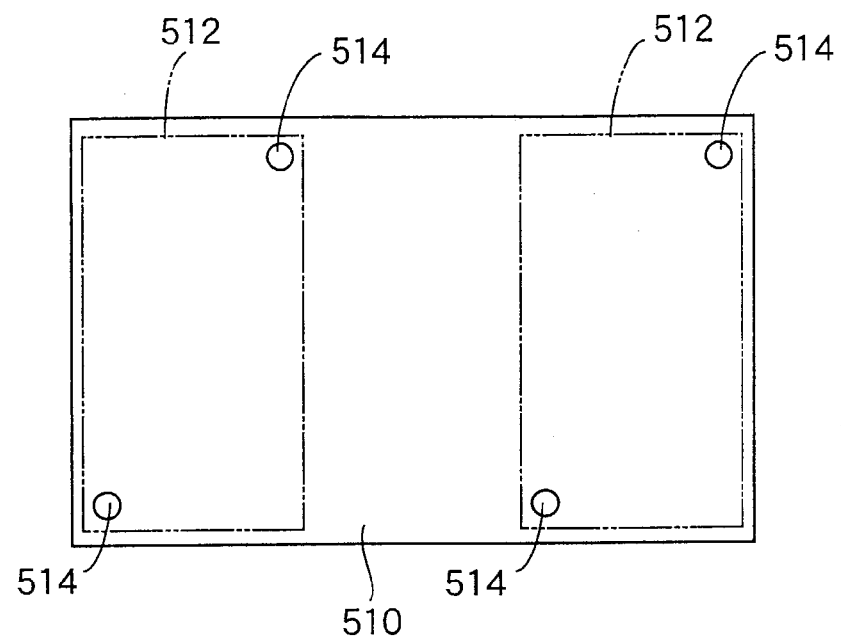
FIG. 18 is a plan view showing a fiducial board used to detect a relative position of a component mounting unit in the above-indicated electronic-circuit-component mounting system.

The fiducial board 510 is an elongate glass board having a length sufficient to cover the component mounting areas 470 of a group of the adjacent two or more component mounting units 412 which are concurrently operated to mount the components 16 on the printed-wiring board 12. In the present embodiment, the length of the fiducial board 510 is sufficient to cover the component mounting areas 470 of the adjacent two units 412. As shown in FIG. 18, the fiducial board 510 has two imaging areas 512 corresponding to the imaging areas of the fiducial-mark cameras 148 of the adjacent two units 412, and fiducial portions in the form of two fiducial marks 514 located within each of the two imaging areas 512. In the specific example of FIG. 18, the two fiducial marks 514 are located at diagonally opposite two corner portions of each rectangular imaging area 512. The fiducial marks 514 preferably have a sufficiently high contrast with respect to the background glass surface. Where the glass fiducial board 510 has a white color, the fiducial marks 514 are preferably black-colored. The fiducial marks 514 may take various shapes such as circular, triangular, rectangular and crisscross shapes, and may have any colors other than black.

There will be described an operation to detect the relative positions of the component mounting units 412, by using the fiducial board 510 constructed as described above. This detection of the relative positions may be effected at a suitable opportunity, for example, upon completion of manufacture of the system 400, upon maintenance inspection of the system 400, upon power application to the system 400, or at a predetermined point of time during a series of component mounting operations (when the components have been mounted on a predetermined number of boards 12), as in the preceding embodiments.

Initially, the fiducial board 510 is manually or automatically loaded onto the board conveyor 14. When a relative-position detecting routine is commanded to be executed, the fiducial board 510 is positioned such that the two imaging areas 512 of the board 510 are aligned with the respective component mounting areas 412 of the adjacent two component mounting units 470 in the X-axis direction.

Figure 19:
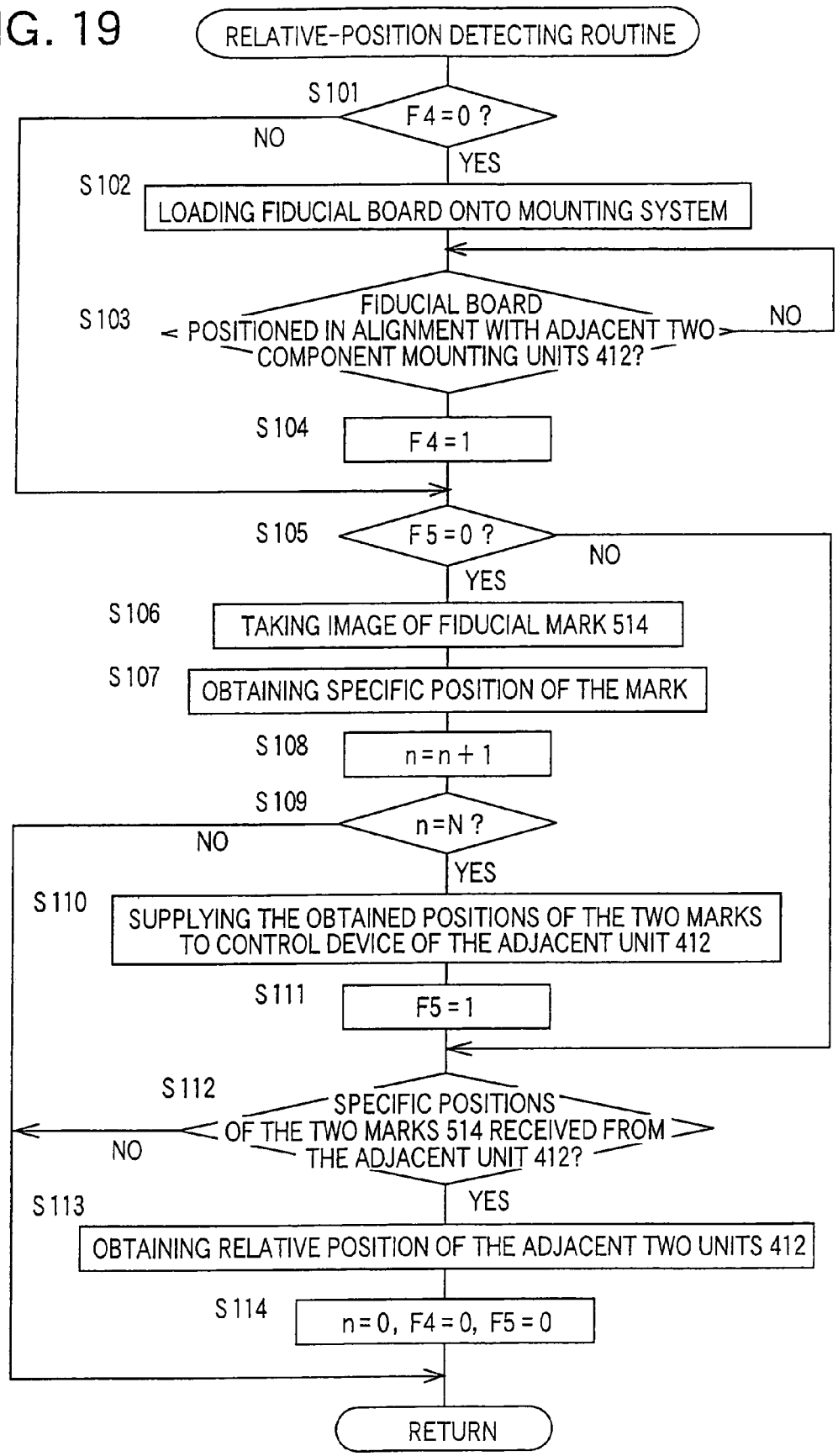
FIG. 19 is a flow chart illustrating a relative-position detecting routine executed by the above-indicated control device.

Then, images of the two fiducial marks 514 are taken by the fiducial-mark camera 148 of each of the adjacent two units 412, to obtain specific positions of the two fiducial marks 514 relative to that unit 412. The control device 500 of each unit 412 supplies the control device 500 of the other unit 412 with information indicative of the obtained specific positions of the two fiducial marks 514. Each control device 500 stores information relating to the fiducial board 510, such as the nominal relative positions of the four fiducial marks 514 in the two imaging areas 512, so that the control device 500 of each unit 412 can obtain imaginary positions of the two fiducial marks 514 located in the second imaging area 512 aligned with the component mounting area 470 of the other unit 412, on the basis of the specific positions of the two fiducial marks 514 located in the first imaging area 512 aligned with the component mounting area 470 of the unit 412 in question. On the basis of the thus obtained imaginary positions of the two fiducial marks 514 in the second imaging area 512 and the specific positions of the same two fiducial marks 514 supplied from the other unit 412, the relative position between the adjacent two units 412 can be calculated. The relative-position detecting routine for detecting this relative position will be described in detail, by reference to the flow chart of FIG. 19.

When the execution of the relative-position detecting routine is requested in the main control program, the routine is initiated with step S101 to determine whether a flag F4 is set at "0". Since this flag F4 is set at the initial value "0" when step S101 is implemented for the first time, an affirmative decision (YES) is obtained in step S101, and the control flow goes to step S102 in which the fiducial board 510 is loaded onto the electronic-circuit-component mounting system 400. Step S102 is followed by step S103 to determine whether the fiducial board 510 has been position such that the two imaging areas 512 are aligned with the respective component mounting areas 470 of the adjacent two units 412. When an affirmative decision (YES) is obtained in step S103, the control flow goes to step S104 to set the flag F4 to "1". After the flag F4 is set to "1", steps S102–S104 are skipped.

The control flow then goes to step S105 to determine whether a flag F5 is set at "0". When the flag F5 is set at the initial value "0", an affirmative decision (YES) is obtained in step S105, and the control flow goes to step S106 in which the image of one of the two fiducial marks 514 in the imaging area 512 of the fiducial board 510 aligned with the component mounting unit 412 in question is taken by the fiducial-mark camera 148 of the unit 412. Step S106 is followed by step S107 in which image data indicative of the image of the first fiducial mark 514 are supplied to the image-processing computer 272, which processes the image data to obtain the position of the first fiducial mark 514, and supplies the computer 250 of the control device 500 with data indicative of the obtained position. Then, the control flow goes to step S108 to increment a counter "n", and to step S109 to determine whether the content of the counter "n" is equal to a predetermined number "N". In this embodiment, this number "N" is set at "2". When step S108 is implemented for the first time, the number "n" is equal to "1", and a negative decision (NO) is obtained in step S109, and one cycle of execution of the routine is terminated. Steps S106 through S109 are repeatedly implemented until the positions of the first and second fiducial marks 514 have been obtained in step S107.

When the specific positions of the two fiducial marks 514 in the imaging area 512 corresponding to the component mounting area 470 of each of the adjacent two component mounting units 412 have been obtained, an affirmative decision (YES) is obtained in step S109, and the control flow goes to step S110 in which the control device 500 of the unit 412 in question supplies the control device 500 of the adjacent unit 412 with the data indicative of the obtained positions of the two fiducial marks 514. Step S110 is followed by step S111 to set the Flag F5 to "1", and step S112 to determine whether the control device 500 has received the data of the positions of the two fiducial marks 514 from the control device 500 of the adjacent unit 412. The received position data are stored in the RAM 246. When a negative decision (NO) is obtained in step S112, one cycle of execution of the routine is terminated. If an affirmative decision (YES) is obtained in step S112, the control flow goes to step S113 in which the relative position between the two adjacent units 412 is obtained on the basis of the positions of the two fiducial marks 514 obtained in the unit 412 in question, and the positions of the two fiducial marks 514 received from the adjacent unit 412. Then, the control flow goes to step S114 to reset the counter "n" to "0", and resets the flags F4 and F5 to "0", and the execution of the routine is terminated. The thus obtained relative position of the two adjacent component mounting units 412 are used to detect the positioning errors of the board 12 relative to the units 412 and to mount the components 16 on the board 12, until the relative position is updated by the next execution of the relative-position detecting routine of FIG. 19.

Figure 20:
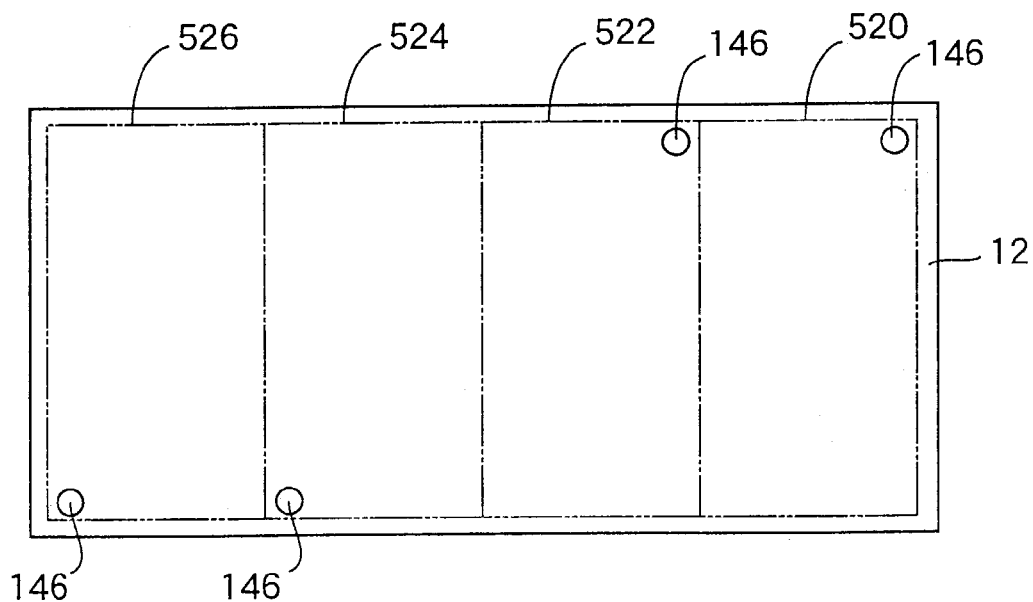
FIG. 20 is a plan view showing a printed-wiring board on which electronic circuit components are to be mounted by the above-indicated electronic-circuit-component mounting system.

Then, an operation to mount the components 16 on the printed-wiring board 12 will be described. In the present system 400, the board 12 has a component mounting area whose length in the X-axis direction is about four times the width of the component mounting area 470 of each component mounting unit 412. As shown in FIG. 20, the component mounting area on the board 12 consists of four sections 520, 522, 524 and 526 which are arranged in the X-axis direction and are referred to as first, second, third and fourth sections as counted in the direction from the downstream side toward the upstream side of the system 400, namely, in the direction opposite to the feeding direction of the board 12. The component mounting operations of the adjacent two units 412 to mount the components 16 in the component mounting area of the board 12 are performed at two different times. That is, the board 12 is first positioned such that the first and third sections 520, 524 of the component mounting area of the board 12 are aligned with the respective component mounting areas 470 of the adjacent two units 412. In this state, the two units 412 are concurrently operated to mount the components 16 in the respective first and third sections 520, 524. Then, the board 12 is fed downwards by a distance equal to the width of each section 520–526, so that the second and fourth sections 522, 526 are aligned with the respective component mounting areas 470 of the adjacent two units 412. In this state, the two units 412 are concurrently operated to mount the components 16 in the respective second and fourth sections 522, 526.

As shown in FIG. 20, the printed-wiring board 12 has four fiducial marks 146 located in the respective four sections 520, 522, 524, 526. In this example, the two fiducial marks 146 are located at the downstream ends of the respective first and second sections 520, 522, while the other two fiducial marks 146 are located at the upstream ends of the respective third and fourth sections 524, 526. Before the components 16 are mounted in the first and third sections 520, 524, the positions of the two fiducial marks located within these sections 520, 524 are detected by the fiducial-mark cameras 148 of the adjacent two units 412, and the relative positioning errors of the board 12 relative to the adjacent two units 412 are obtained on the detected positions of those two fiducial marks 146, and the already detected relative position of the adjacent two units 412. On the basis of the thus obtained positioning errors of the board 12, the amounts of compensation of the predetermined component mounting positions of the mounting heads 144 are calculated, and the mounting heads 144 are moved to the compensated component mounting positions at which the components 16 are mounted on the board 12. In this embodiment, too, the component mounting positions are compensated for not only the positioning errors of the board 12, but also the positioning errors of each component 16 as held by each mounting head 144.

In the present embodiment, the control devices 500 of the plurality of component mounting units 412 are directly connected to each other for mutual data communication. However, the control devices 500 are connected in parallel to the host computer 280 so that each control device 500 supplies the other control devices 500 with necessary data or information. Further, a common computer such as a host computer provided commonly for all of the component mounting units 412 may be assigned to effect at least one of the detection of the relative position of the units 412, the detection of the positioning errors of the board 12 relative to the units 412, and the compensation of the component mounting positions of the mounting heads 144.

The fiducial board 510 used in the third embodiment may be used in the first and second embodiments in which the component mounting areas of the plurality of component mounting units 100, 300 (the imaging areas of the fiducial-mark cameras 148) partially overlap each other. That is the fiducial board 510 is used in place of the calibration marks 160 fixedly provided on the machine base 10, 410. Where the relative positioning errors of the units 100, 300, 412 are negligibly small, the positioning errors of the board 12 relative to the units can be detected by taking the image of only one fiducial mark provided in each section of the imaging area on the fiducial board 510, as in the third embodiment. Where the relative positioning errors of the units are not negligibly small, the fiducial board 510 is required to have at least two fiducial marks in each section of its imaging area. In either of these cases, the printed-wiring board 12 is required to have at least two fiducial marks 146 corresponding to at least two of a group of component mounting units, so that the images of those at least two fiducial marks 146 are taken by the fiducial-mark cameras 148 of the respective at least two units.

While the several preferred embodiments of this invention have been described in detail, for illustrative purpose only, it is to be understood that the present invention may be embodied with various changes and improvements such as those described in the SUMMARY OF THE INVENTION, which may occur to those skilled in the art.

What is claimed is:

1. A method of obtaining positioning errors of a printed-wiring board on which components are to be mounted by a plurality of component mounting units each of which includes a mounting head, a head drive device operable to move the mounting head, and a recognition device, said method comprising:
   a board-positioning step of positioning said printed-wiring board relative to said plurality of component mounting units such that areas of movements of the mounting heads of said plurality of component mounting units cover respective parts of said printed-wiring board, in a direction of arrangement of said component mounting units;
   a board-fiducial-portion recognizing step of operating said recognition device of each of at least two of said plurality of component mounting units to recognize at least one of a plurality of fiducial portions of said printed-wiring board, which is recognizable by said recognition device;
   a specific-position obtaining step of obtaining specific positions of each of said at least one of said plurality of fiducial portions, in respective specific coordinate systems respectively specific to said at least two component mounting units, on the basis of results of recognition of said each of said at least one of said plurality of fiducial portions by said recognition devices of said at least two component mounting units in said board-fiducial-portion recognizing step; and a positioning-error obtaining step of obtaining positioning errors of said printed-wiring board relative to said specific coordinate systems of said plurality of component mounting units, on the basis of said specific positions of said each of said at least one of said plurality of fiducial portions, which specific positions have been obtained in said specific-position obtaining step.

2. The method according to claim 1, wherein said specific-position obtaining step is implemented by a control device of each of said at least two component mounting units, and said positioning-error obtaining step comprises (a) controlling said control device of each of said at least two component mounting units so as to receive the specific position of each of said at least one of said plurality of fiducial portions which has been obtained by a control device of each of the other of said at least two component mounting units, and (b) obtaining said positioning errors of said printed-wiring board on the basis of the specific position received from the control device of said each of said other of said at least two component mounting units, and the specific position of each of said at least one of said plurality of fiducial portions which has been obtained by the control device of said each component mounting unit.

3. The method according to claim 1, wherein the results of recognition of said each of said at least one of said plurality of fiducial portions by said recognition devices of said at least two component mounting units are supplied to a common computer provided commonly for all of said plurality of component mounting units, and said specific-position obtaining step and said positioning-error obtaining step are implemented by said common computer.

4. The method according to claim 1, further comprising a relative-position obtaining step implemented before said positioning-error obtaining step, to obtain a relative position of said plurality of component mounting units, and said positioning-error obtaining step comprises obtaining said positioning errors of said printed-wiring board on the basis of not only said specific positions obtained in said specific-position obtaining step, but also said relative position obtained in said relative-position obtaining step.

5. The method according to claim 4, wherein said relative-position obtaining step comprises:

a machine-fiducial-portion recognizing step of operating said recognition devices provided on the mounting heads of said plurality of component mounting units, to recognize a plurality of machine fiducial portions fixed in position relative to said mounting heads, said plurality of machine fiducial portions including a plurality of specific fiducial portions provided exclusively for said plurality of component mounting units, and at least one common fiducial portion provided commonly for adjacent ones of said plurality of component mounting units; and a step of obtaining the relative position between said adjacent ones of said plurality of component mounting units, on the basis of results of recognition of said recognition devices of said machine fiducial portions in said machine-fiducial-portion recognizing step.

6. The method according to claim 4, wherein said relative-position obtaining step comprises:

a step of preparing a fiducial board having a length in the direction of arrangement of said plurality of component mounting units, which length is large enough to extend through at least a part of said area of movement of said mounting head of each of said plurality of component mounting units, said fiducial board having at least one board fiducial portion corresponding to said area of movement of the mounting head of said each component mounting unit;

a board-fiducial-portion recognizing step of positioning said fiducial board such that the areas of movement of the mounting heads of the plurality of component mounting units cover respective parts of said fiducial board each of which has said at least one fiducial portion, and operating said recognition device provided on said mounting head of said each component mounting unit, to recognize at least one of said at least one board fiducial portion; and a step of obtaining the relative position of said plurality of component mounting units on the basis of a result of recognition of said board fiducial portions by said recognition devices in said board-fiducial-portion recognizing step.

7. The method according to claim 1, wherein said recognition device is provided on said mounting head of each of said plurality of component mounting units.

8. The method according to claim 1, wherein said positioning-error obtaining step comprises a step of obtaining an imaginary coordinate system for said printed-wiring board, relative to said specific coordinate systems specific to said plurality of component mounting units, on the basis of said specific positions of said each of said at least one of said plurality of fiducial portions which have been obtained in said specific-position obtaining step.

9. A method of mounting electronic circuit components on a printed-wiring board, comprising:

a board-positioning step of positioning said printed-wiring board relative to said plurality of component mounting units such that areas of movements of the mounting heads of said plurality of component mounting units cover respective parts of said printed-wiring board, in a direction of arrangement of said component mounting units;

a board-fiducial-portion recognizing step of operating said recognition device of each of at least two of said plurality of component mounting units to recognize at least one of a plurality of fiducial portions of said printed-wiring board, which is recognizable by said recognition device;

a specific-position obtaining step of obtaining specific positions of each of said at least one of said plurality of fiducial portions, in respective specific coordinate systems respectively specific to said at least two component mounting units, on the basis of results of recognition of said each of said at least one of said plurality of fiducial portions by said recognition devices of said at least two component mounting units in said board-fiducial-portion recognizing step; and a positioning-error obtaining step of obtaining positioning errors of said printed-wiring board relative to said specific coordinate systems of said plurality of component mounting units, on the basis of said specific positions of said each of said at least one of said plurality of fiducial portions, which specific positions have been obtained in said specific-position obtaining step; and a mounting step of mounting the electronic circuit components on said printed-wiring board by said plurality of component mounting units, such that component mounting positions at which the printed-wiring board and the mounting heads of said plurality of component mounting units are positioned relative to each other to mount said electronic circuit components on the printed-wiring board are compensated for at least said positioning errors of the printed-wiring board obtained in said positioning-error obtaining step.

10. The method according to claim 9, wherein said positioning-error obtaining step comprises a step of obtaining an imaginary coordinate system for said printed-wiring board, relative to said specific coordinate systems specific to said plurality of component mounting units, on the basis of said specific positions of said each of said at least one of said plurality of fiducial portions which have been obtained in said specific-position obtaining step, said method of mounting electronic circuit components further comprising a converting step of converting coordinate values of a plurality of mounting points of the electronic circuit components predetermined in a nominal coordinate system set for a nominal printed-wiring board, into values relating to said mounting points in said specific coordinate systems, on the basis of positional relationships among said nominal coordinate system for the printed-wiring board, said imaginary coordinate system obtained for said printed-wiring board, and said specific coordinate systems of said component mounting units.

11. A program for obtaining positioning errors of a printed-wiring board on which components are to be mounted by a plurality of component mounting units each of which includes a mounting head, a head drive device operable to move the mounting head, and a recognition device, comprising:
　a board-positioning step of positioning said printed-wiring board relative to said plurality of component mounting units such that areas of movements of the mounting heads of said plurality of component mounting units cover respective parts of said printed-wiring board, in a direction of arrangements of said component mounting units;
　a recognition-result obtaining step of operating said recognition device of each of at least two of said plurality of component mounting units to recognize at least one of a plurality of fiducial portions of said printed-wiring board, which is recognizable by said recognition device, and obtaining information indicative of results of recognition of each of said at least one of said plurality of fiducial portions by said recognition devices of said at least two component mounting units;
　a specific-position obtaining step of obtaining specific positions of said each of said at least one of said plurality of fiducial portions, in respective coordinate systems respectively specific to said at least two component mounting units, on the basis of said results of recognition obtained in said recognition-result obtaining step; and
　a positioning-error obtaining step of obtaining positioning errors of said printed-wiring board relative to said specific coordinate systems of said plurality of component mounting units, on the basis of said specific positions of said each of said at least one of said plurality of fiducial portions, which specific positions have been obtained in said specific-position obtaining step.

12. A program for obtaining positioning errors of a printed-wiring board on which electronic circuit components are to be mounted by an electronic-circuit-component mounting system comprising (a) a plurality of component mounting units arranged along a straight line and including respective mounting heads and head drive devices operable to move the respective mounting heads, (b) a conveying device operable to transfer said printed-wiring board along said straight line and stop said printed-wiring board at a predetermined position relative to at least two units of said plurality of component mounting units such that areas of movement of the mounting heads of said at least two units cover respective parts of the printed-wiring board, (c) a plurality of individual control devices including respective computers and operable to control said plurality of component mounting units, respectively, and (d) a plurality of recognition devices respectively provided for said plurality of component mounting units and operable to recognize fiducial portions of said printed-wiring board stopped at said predetermined position, said program being executed by each of said computers and comprising:
　a positioning-error obtaining step of obtaining positioning errors of said printed-wiring board stopped at said predetermined position, with respect to a specific coordinate system specific to one of said at least two units, on the basis of a position of at least one of said fiducial portions of the printed-wiring board in said specific coordinate system for said one of said at least two units, and a position of at least one other of said fiducial portions in a specific coordinate system specific for another of said at least two units, said positions of said at least one and at least one other of said fiducial portions being obtained on the basis of results of recognition of said at least one and at least one other of said fiducial portions by the recognition devices corresponding to said one and another of said at least two units.

13. A program for mounting electronic circuit components on a printed-wiring board by an electronic-circuit-component mounting system comprising (a) a plurality of component mounting units arranged along a straight line and including respective mounting heads and head drive devices operable to move the respective mounting heads, (b) a conveying device operable to transfer said printed-wiring board along said straight line and stop said printed-wiring board at a predetermined position relative to at least two units of said plurality of component mounting units such that areas of movement of the mounting heads of said at least two units cover respective parts of the printed-wiring board, (c) a plurality of individual control devices including respective computers and operable to control said plurality of component mounting units, respectively, and (d) a plurality of recognition devices respectively provided for said plurality of component mounting units and operable to recognize fiducial portions of said printed-wiring board stopped at said predetermined position, said program being executed by each of said computers and comprising:
　a positioning-error obtaining step of obtaining positioning errors of said printed-wiring board stopped at said predetermined position, with respect to a specific coordinate system specific to one of said at least two units, on the basis of a position of at least one of said fiducial portions of the printed-wiring board in said specific coordinate system for said one of said at least two units, and a position of at least one other of said fiducial portions in a specific coordinate system specific for another of said at least two units, said positions of said at least one and at least one other of said fiducial portions being obtained on the basis of results of recognition of said at least one and at least one other of said fiducial portions by the recognition devices corresponding to said one and another of said at least two units; and a mounting controlling step of compensating a plurality of nominal mounting points of said electronic circuit components predetermined for a nominal printed-wiring board, for at least the positioning errors of said printed-wiring board obtained in said positioning-error obtaining step, and controlling said at least two units of said plurality of component mounting units to mount the electronic circuit components at the compensated nominal mounting points.

* * * * *